(12) United States Patent
Joshi et al.

(10) Patent No.: US 12,094,527 B2
(45) Date of Patent: Sep. 17, 2024

(54) RECONFIGURABLE DATA PROCESSING AND STORAGE UNIT FOR DEEP NEURAL NETWORKS

(71) Applicant: International Business Machines Corporation, Armonk, NY (US)

(72) Inventors: Rajiv Joshi, Yorktown Heights, NY (US); Sudipto Chakraborty, Plano, TX (US)

(73) Assignee: International Business Machines Corporation, Armonk, NY (US)

( * ) Notice: Subject to any disclaimer, the term of this patent is extended or adjusted under 35 U.S.C. 154(b) by 149 days.

(21) Appl. No.: 17/709,794

(22) Filed: Mar. 31, 2022

(65) Prior Publication Data

US 2023/0317149 A1    Oct. 5, 2023

(51) Int. Cl.
| | |
|---|---|
| G11C 11/412 | (2006.01) |
| G06N 3/065 | (2023.01) |
| G11C 11/418 | (2006.01) |
| G11C 11/419 | (2006.01) |
| H03M 1/66 | (2006.01) |

(52) U.S. Cl.
CPC ........... *G11C 11/418* (2013.01); *G06N 3/065* (2023.01); *G11C 11/412* (2013.01); *G11C 11/419* (2013.01); *H03M 1/66* (2013.01)

(58) Field of Classification Search
CPC ... G11C 11/418; G11C 11/412; G11C 11/419; G06N 3/065; H03M 1/66
USPC ........................................................ 365/154
See application file for complete search history.

(56) References Cited

U.S. PATENT DOCUMENTS

| | | |
|---|---|---|
| 8,139,400 B2 | 3/2012 | Bansal et al. |
| 9,697,877 B2 | 7/2017 | Shanbhag |
| 10,705,798 B2 | 7/2020 | Tiwari |
| 10,825,509 B2 | 11/2020 | Sumbul |
| 11,018,687 B1 | 5/2021 | Srivastava |

(Continued)

FOREIGN PATENT DOCUMENTS

| | | |
|---|---|---|
| GB | 2583121 B | 9/2021 |
| KR | 20200103262 A | 9/2020 |
| WO | 2020139895 A1 | 7/2020 |

OTHER PUBLICATIONS

European Patent Office as ISA, Authorized officer Pozzi, Sandra, related PCT application PCT/EP2023/056177, Provisional Opinion Accompanying the Partial Search Result. mailed on Jun. 16, 2023. pp. 17.

(Continued)

*Primary Examiner* — Ly D Pham
(74) *Attorney, Agent, or Firm* — Erik Johnson; Otterstedt & Kammer PLLC

(57) ABSTRACT

An apparatus includes a memory array. The array in turn includes a plurality of word lines, a plurality of bit line pairs intersecting the plurality of word lines at a plurality of cell locations, and a plurality of memory cells, coupled to the plurality of word lines and the plurality of bit line pairs, and located at the plurality of cell locations. A plurality of word line drivers are coupled to the plurality of word lines, a dynamic voltage boost is coupled to the memory array, and a controller is coupled to the plurality of word line drivers and the dynamic voltage boost. The controller is configured to cause the dynamic voltage boost to boost the cells during a multiply accumulate operation.

16 Claims, 15 Drawing Sheets

(56) References Cited

U.S. PATENT DOCUMENTS

| | | | |
|---|---|---|---|
| 11,061,646 | B2 | 7/2021 | Sumbul |
| 11,176,991 | B1 * | 11/2021 | Shaik ................. G11C 11/4096 |
| 2015/0003174 | A1 | 1/2015 | Joshi |
| 2020/0387352 | A1 | 12/2020 | Chawla |
| 2021/0271597 | A1 | 9/2021 | Verma |

OTHER PUBLICATIONS

Chandramoorthy Nandhini et al: "Resilient Low Voltage Accelerators for High Energy Efficiency", 2019 IEEE International Symposium on High Performance Computer Architecture (HPCA), IEEE, Feb. 16, 2019 (Feb. 16, 2019), pp. 147-158.

Kim Donghyuk et al: "An Overview of Processing-in-Memory Circuits for Artificial Intelligence and Machine Learning", IEEE Journal on Emerging and Selected Topics in Circuits and Systems, IEEE, Piscataway, NJ, USA, vol. 12, No. 2, Mar. 17, 2022 (Mar. 17, 2022), pp. 338-35.

Paul, R., Sarkar, S., Sau, S., Chakraborty, K., Roy, S., & Chakrabarti, A. (Feb. 2021). Voltage Scaling for Partitioned Systolic Array in a Reconfigurable Platform. arXiv:2102.06888v1 [cs.AR] Feb. 13, 2021. pp. 6.

Rumberg, B., Clites, S., Abulaiha, H., DiLello, A., & Graham, D. (Mar. 2021). Continuous-Time Programming of Floating-Gate Transistors for Nonvolatile Analog Memory Arrays. J. Low Power Electron. Appl. Jan. 13, 2021, pp. 21.

Jintao Zhang, et sl., A machine-learning classifier implemented in a standard 6T SRAM array. P2016 IEEE Symposium on VLSI Circuits (VLSI-Circuits). pp. 2 Jun. 15, 2016.

Mauck BM, Ravichandran V, Mughal UA. A design for test technique for parametric analysis of SRAM: On-die low yield analysis. In2004 International Conference on Test Oct. 26, 2004 (pp. 105-113). IEEE.

European Patent Office as ISA, Authorized officer Pozzi, Sandra, related PCT application PCT/EP2023/056177, ISR & WO. mailed on Aug. 8, 2023 pp. 20.

\* cited by examiner

RECONFIGURABLE DATA PROCESSING AND STORAGE UNIT FOR DEEP NEURAL NETWORKS

BACKGROUND

The present invention relates to the electrical, electronic, and computer arts, and more specifically, to electronic circuitry suitable for in-memory computation for artificial intelligence (AI) applications and the like.

AI is widely used for many applications, such as object recognition, voice recognition, image classification, financial applications, and so on. It is desirable that modern AI systems be capable of efficient local decision-making, require only infrequent communications to the cloud, and be capable of secure calculations. Further, these goals should be achievable at low power, high throughput, and with processing in real time.

Current AI applications are very computationally intensive. Conventional all-digital implementations require large amounts of data transfer to and from memory. Approaches have been proposed wherein multiply accumulate (MAC) computations are carried out in memory; i.e., in-memory computation. However, there are limitations with regard to noise margin, high power consumption, limited analog capability, low throughput, and high latency. Furthermore, such current approaches are still binary and may have inaccuracies with regard to weight manipulations. Other Non-Volatile Memories (e.g., ReRAM, FeRAM, MRAM and others) have also been proposed but may need some additional work before deployment for some applications.

SUMMARY

Principles of the invention provide techniques for a reconfigurable data processing and storage unit for deep neural networks. In one aspect, an exemplary apparatus includes a memory array, in turn including a plurality of word lines, a plurality of bit line pairs intersecting the plurality of word lines at a plurality of cell locations, and a plurality of memory cells, coupled to the plurality of word lines and the plurality of bit line pairs, and located at the plurality of cell locations; a plurality of word line drivers coupled to the plurality of word lines; a dynamic voltage boost coupled to the memory array; and a controller coupled to the plurality of word line drivers and the dynamic voltage boost, and configured to cause the dynamic voltage boost to boost the cells during a multiply accumulate operation.

In another aspect, a hardware description language (HDL) design structure is encoded on a machine-readable data storage medium, and the HDL design structure includes elements that when processed in a computer-aided design system generates a machine-executable representation of an apparatus. The HDL design structure includes an apparatus as just described.

In still another aspect, an exemplary method includes providing a memory array such as described above, with stored neural network weights; during a multiply accumulate operation, applying elements of an input vector to the wordline drivers; and during the multiply accumulate operation, causing a dynamic voltage boost to boost the plurality of memory cells.

In a further aspect, another exemplary method includes providing a memory array such as described above; providing a control signal to the plurality of word line drivers to cause the memory array to enter a digital-to-analog converter (DAC) mode; applying a multibit digital input; and converting the multibit digital input to an analog output voltage corresponding to a supply voltage less a resistance times a unit current times an expression derived from the multibit digital input.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor and/or semiconductor fabrication equipment, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in hardware such as digital and/or analog circuitry. This circuitry can then be used in a computer to train/execute (i.e., carry out inference with) machine learning software in a computationally efficient manner. The machine learning software can be implemented in the form of a computer program product including a computer readable storage medium with computer usable program code for facilitating or otherwise performing one, some, or all of the method steps indicated. The software can then be executed on a system (or apparatus) including a memory, and at least one processor that is coupled to the memory and operative to perform exemplary machine learning training and/or inference; the processor can be configured as described herein.

Techniques of the present invention can provide substantial beneficial technical effects. Some embodiments may not have these potential advantages and these potential advantages are not necessarily required of all embodiments. For example, one or more embodiments provide:

reduction in instability (helping to ensure a successful MAC operation);

robustness from a noise perspective (helping to ensure a successful MAC operation);

easy detection of defective cells;

low latency;

cost-efficient calculations;

reduced power consumption;

reconfigurability of DAC (DAC=digital-to-analog converter), i.e., using an SRAM (static random access memory) cell as the unit cell for a DAC, increasing the number of bits of resolution of the DAC (the number of possible output levels the DAC is designed to reproduce is usually stated as the number of bits it uses, which is the binary logarithm of the number of levels; resolution is related to the effective number of bits which is a measurement of the actual resolution attained by the DAC, and determines color depth in video applications and audio bit depth in audio applications);

increased density/reduced area; and/or a system that can be used purely as a DAC, storage element, or MAC (3 in 1 combination).

These and other features and advantages of the present invention will become apparent from the following detailed description of illustrative embodiments thereof, which is to be read in connection with the accompanying drawings.

DETAILED DESCRIPTION

Figure 1:
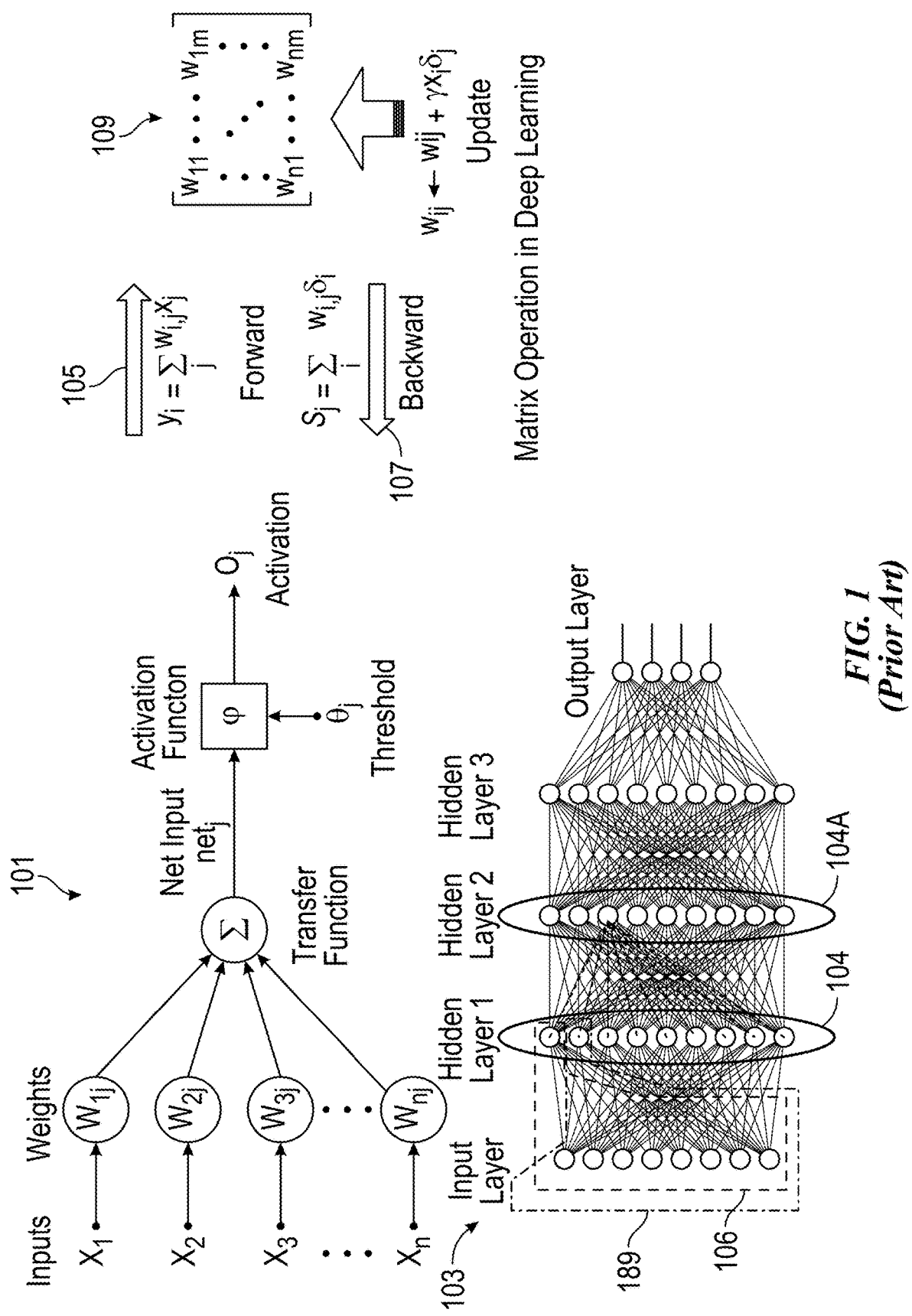
FIG. 1 shows prior art aspects of neural networks.

Referring to FIG. 1, one key element in deep learning is the perceptron 101, where input from many sources is accumulated and a response is triggered when a threshold $\theta_j$ is reached. A neural network is an interconnected system of perceptrons. A deep neural network (DNN) 103 is one type of deep learning network. A string of layers (multilayer perceptron) are connected with initial weights at random values. Note, for example, layers 104, 104A; the DNN is formed of several layers (in the example, the input layer (not separately numbered), three hidden layers (hidden layer 1 104, hidden layer 2 104A, and hidden layer 3, not separately numbered), and the output layer (not separately numbered). Weights $w_{i,j}$ are determined during training, in which known data is presented and processed. For example, in supervised training, both the inputs and the outputs are provided. The network then processes the inputs (during forward propagation 105) and compares its resulting outputs against the desired outputs. Errors are then propagated back through the system (backpropagation 107), causing the system to adjust the weights 109 which control the network. Many repeated cycles are needed to complete training (which is very computationally intensive).

Once the network is trained, it can be used for inference (classification), during which only forward propagation is required. Outline 106 represents, for example, summing the products of the weights and the inputs at the top neuron in the layer 104, while outline 189 represents, for example, summing the products of the weights and the inputs at the second neuron in the layer 104; in each case, in accordance with view 101 and summation 105. The skilled artisan will be familiar with the concepts, processes, and variable names in FIG. 1.

Figure 2:
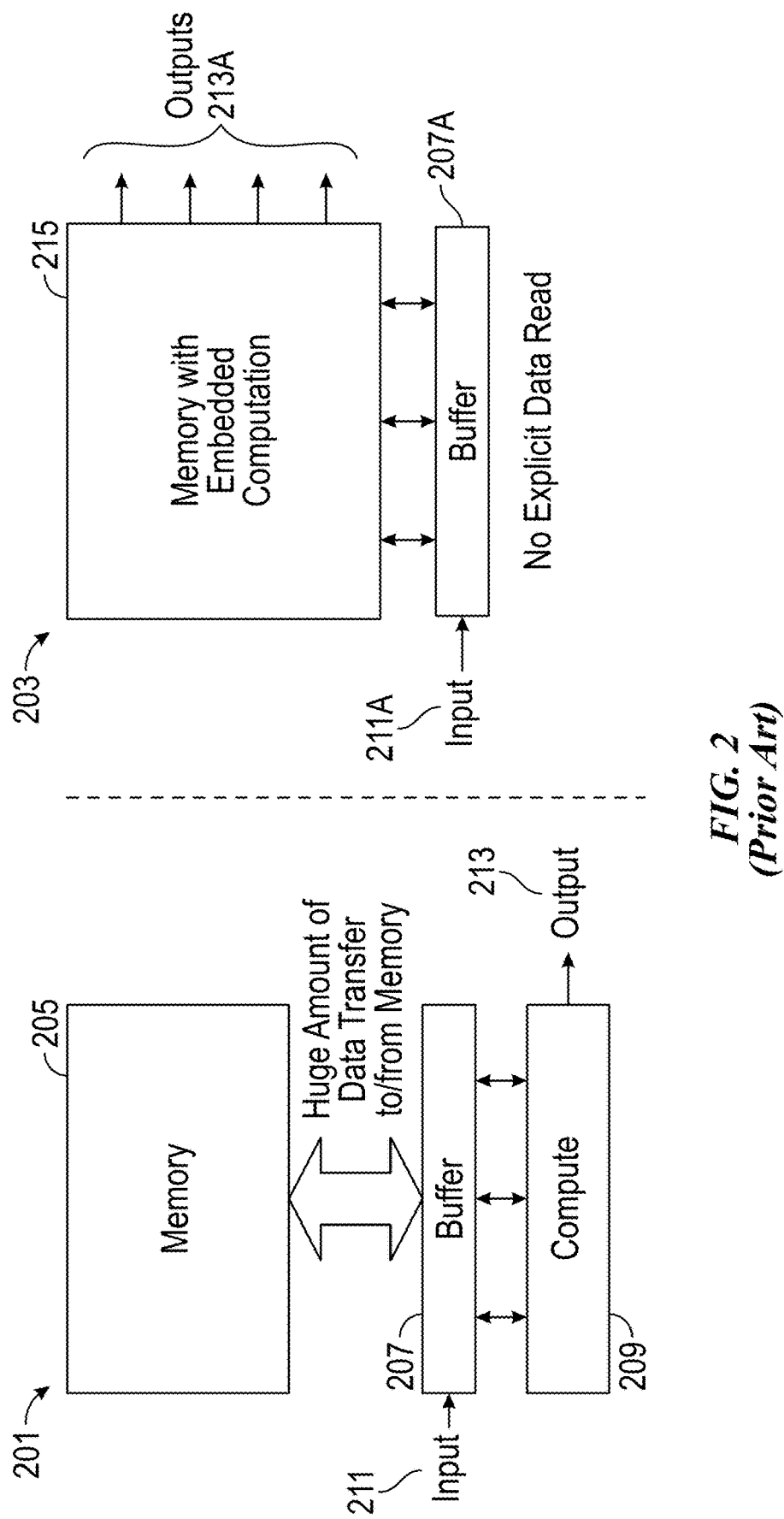
FIG. 2 compares Von Neumann and non-Von Neumann architectures, as known from the prior art.

FIG. 2 shows conventional all-digital computation 201 versus in-memory computation 203. In the conventional all-digital approach 201, input 211 is provided to buffer 207 and a very large amount of data transfer is required to and from memory 205, with computation 209 outside of the memory, and output at 213. On the other hand, in the in-memory approach 203, computation is carried out within the memory 215, input 211A is to the buffer 207A, and the outputs 213A are directly from the memory 215. No explicit data read is needed, and less data transfer is needed as compared to approach 201, implying greater energy efficiency. Furthermore, massively parallel operations are possible, implying higher bandwidth. One or more embodiments improve upon the in-memory approach depicted in view 203.

Figure 3:
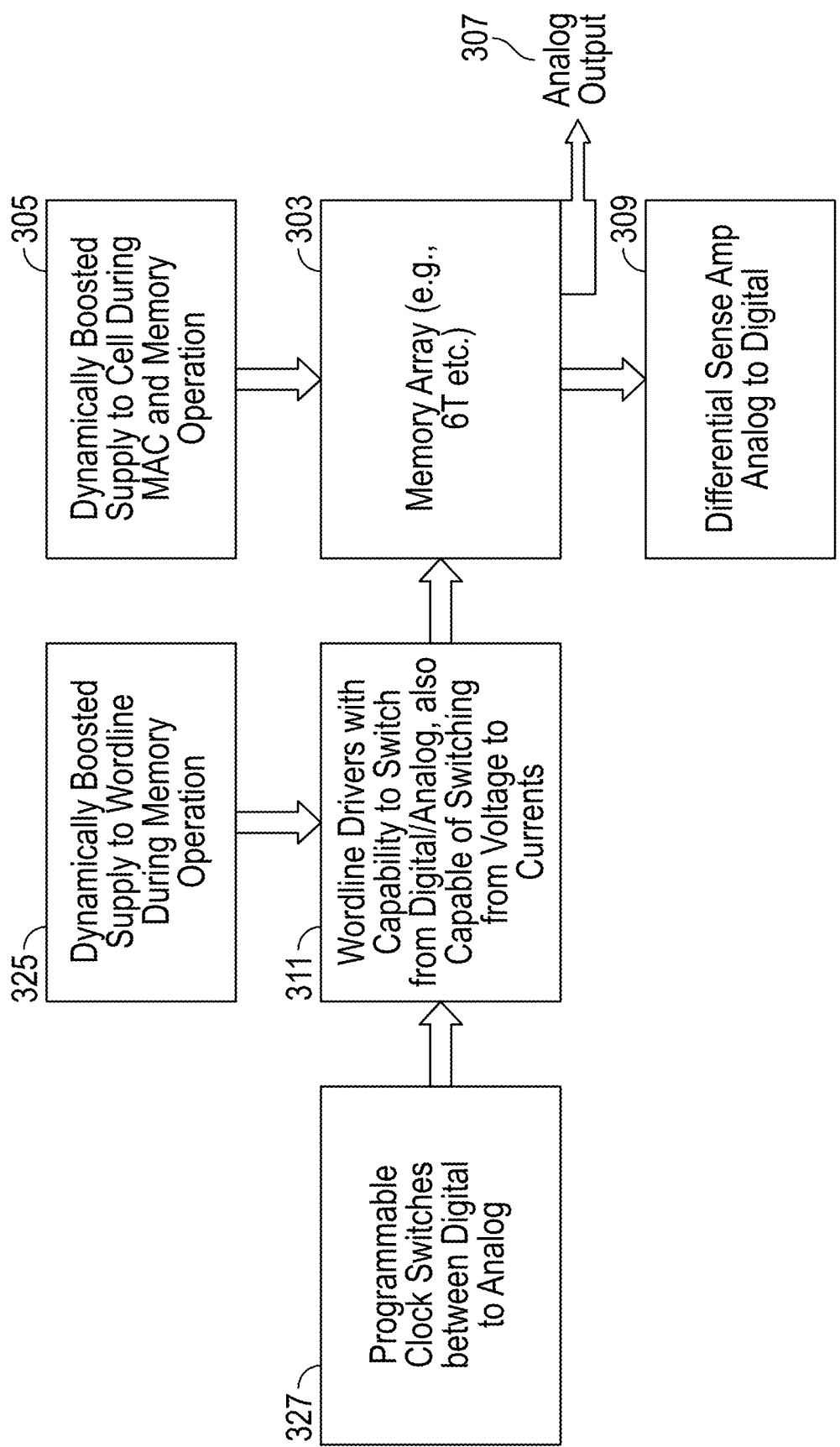
FIG. 3 is a block diagram of a reconfigurable data processing and storage unit, according to an aspect of the invention.
Figure 4:
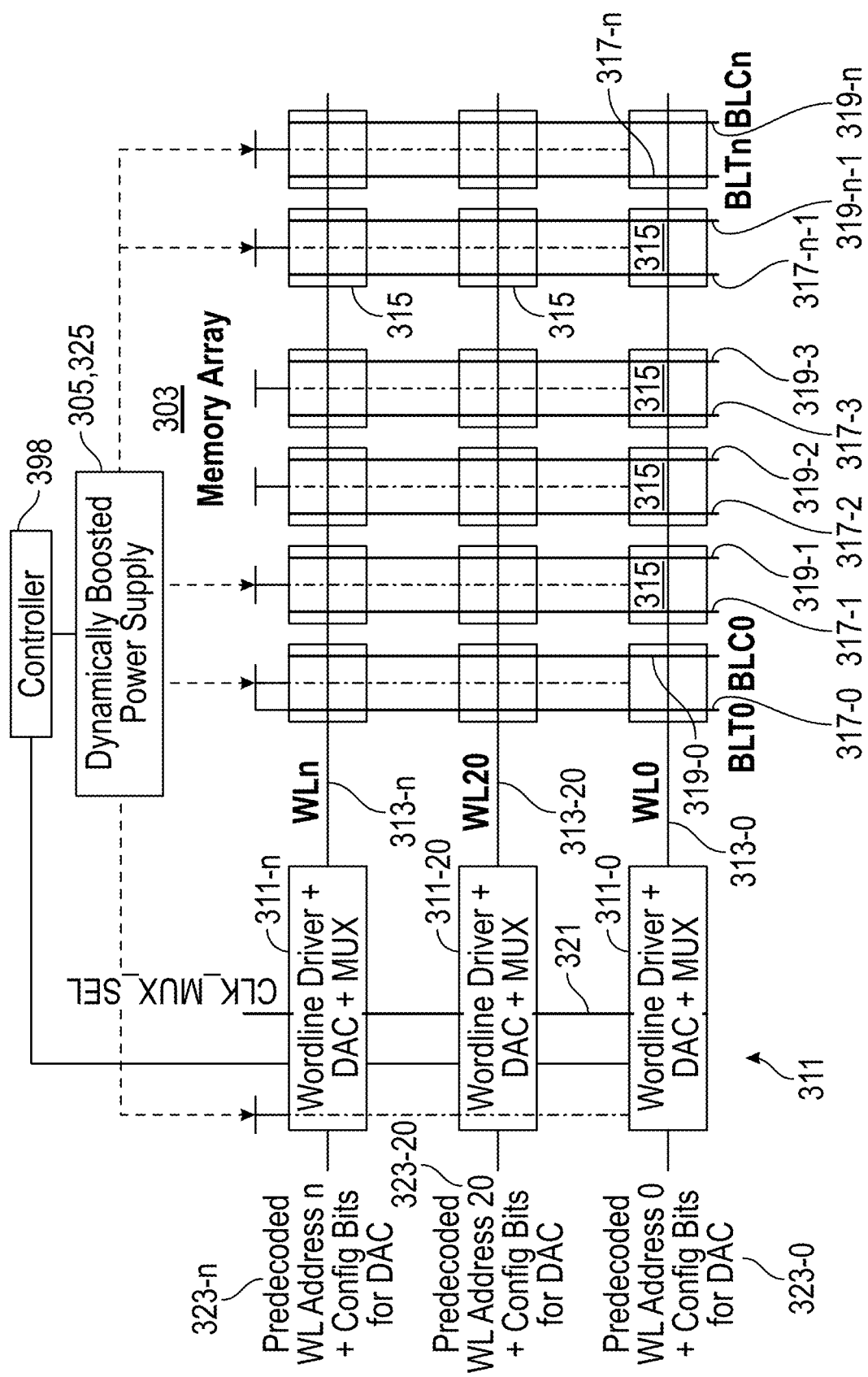
FIG. 4 is a detailed diagram of an exemplary memory array and related elements suitable for the reconfigurable data processing and storage unit, according to an aspect of the invention.

Referring now to FIGS. 3 and 4, in one or more embodiments, weights are stored in-memory (in memory array 303, e.g., in a nanosheet static random access memory (SRAM) with an array of storage elements or cells 315). Analog signals are generated for AI applications (e.g., multiply-accumulate or MAC operations) through a DAC-like structure (DAC=digital-to-analog converter) using an equation similar to 105 in FIG. 1.

Dot product or multiplication is done inside the memory 303 (i.e., computation in memory=CIM) using $x_j$ as the analog inputs and the $w_{i,j}$ stored as binary weights (i.e., in one or more embodiments, the weights are either zero or one—the skilled artisan will be familiar with machine learning schemes where the weights are restricted to two values; the binary zero and one can be mapped to any two weight values). The increased instability which is the bottleneck of current implementations of such systems is advantageously reduced or eliminated, in one or more embodiments, by boosting the SRAM cell array 303 during the MAC operation, as seen at 305. The analog output 307 can be maintained as analog or can be driven out as digital ones and zeroes, via analog-to-digital conversion in differential sense amplifier 309. The system can be used purely as a DAC, as a storage element, or to carry out multiply-accumulate (MAC) operations (or as a 2-in-1 or 3-in-1 combination). For example, the storage aspect stores weights from training; the MAC operation is useful for inferencing when the training is complete (and uses the stored weights); and the DAC aspect can be used as desired (e.g., in a stand-alone DAC mode such as may be useful for quantum computing or the like). The ability to "double" as a DAC saves chip footprint in one or more embodiments, for example.

One or more embodiments focus on the inference process in neural networks. In FIG. 1, the summation equation 105 involving weight and input variables is given for a node. There are several nodes in a layer with summation as discussed above. All the vertical nodes form the layer(s) 104, 104A, . . . of the neural network. The activation function, $\varphi$, seen in view 101 in FIG. 1, helps to bound the weight defined by the activation function to avoid unnecessary calculations. These weights are then transferred to the next layer (e.g., from 104 to 104A and so on). In a Deep Neural Network (DNN), there can be many layers (e.g., N layers with N≥1). In short, the memory content includes the weights of the neural network and the wordline input is the variable (vector X with elements $x_j$) (note the wordlines 313-0, ..., 313-20, ..., 313-n in FIG. 4, discussed further below).

Figure 6:
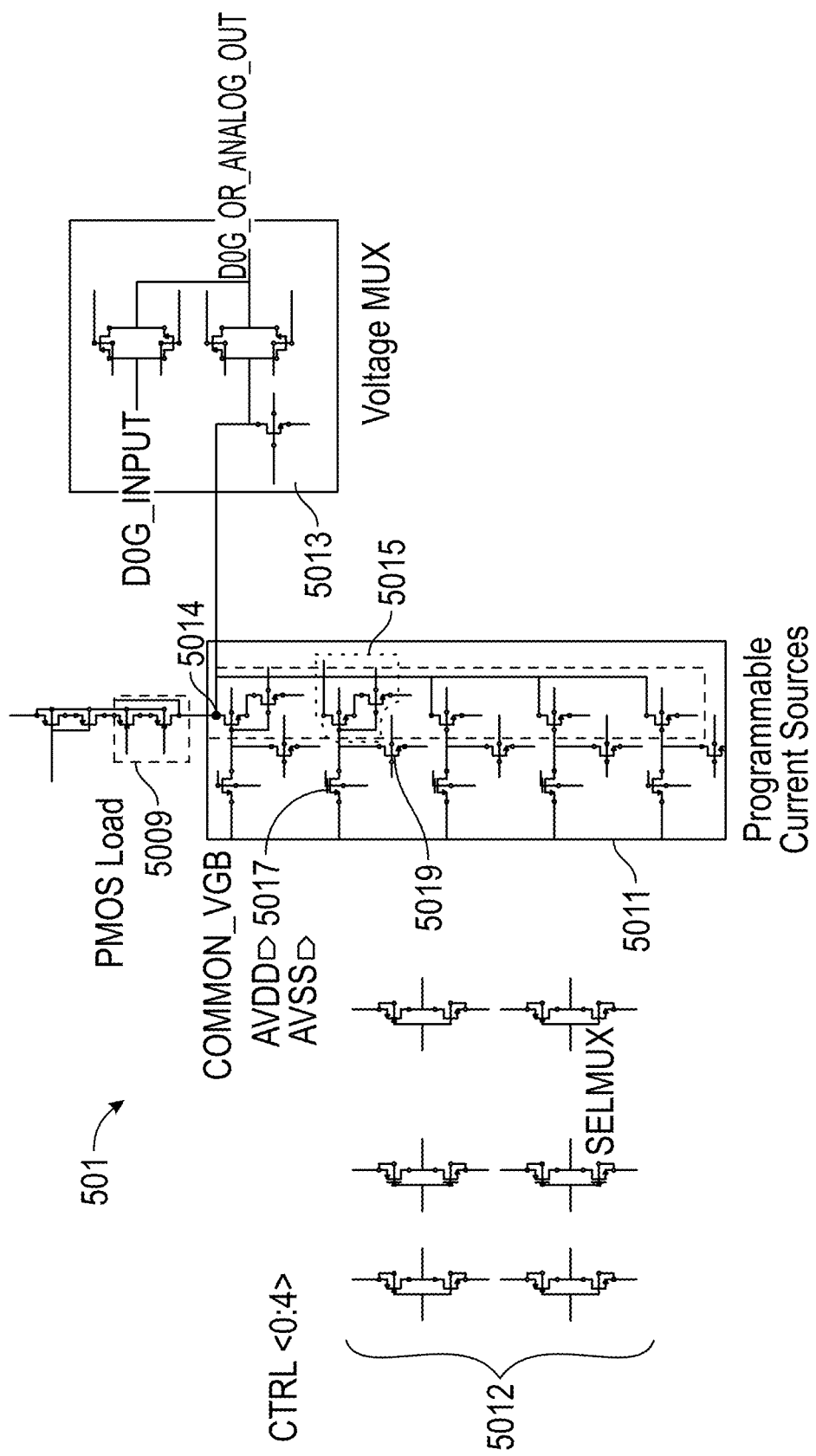
FIG. 6 shows details of the digital to analog converter (DAC), according to aspects of the invention.

The voltage or pulse width of the wordline can be changed so that the input variables can take analog form. Using a configuration "config" bit, one or more embodiments can be switched from only one wordline turned on (storage or memory mode) to several wordlines turned on, to allow memory content (i.e., weights) to be read out. Using Kirchhoff's law, the currents from these memory cells are added or subtracted and the nodal value $y_i$ as shown in FIG. 1 is calculated (i.e., output element)), for each column yields output vector 17). This is referred to as a Multiply and Accumulate (MAC) operation. A memory or storage operation is as follows: for updating the weight (i.e., as a result of training), only one wordline is turned on at a time and through write control ON (WRT_ENB high), the data is written in each selected column till all the cells in the column are written. For a DAC operation, through the same "config" bit, those of the wordlines with non-zero input (all or part) can be turned on. Digital or analog voltages are generated as shown in FIG. 6, and the cell content can be added or subtracted and used for analog conversion. Note the wordline drivers 311 discussed in greater detail with respect to FIG. 4.

Memory array 303 can use conventional 6T storage elements or memory elements of a different style such as 8T or 10T. In AI applications, it is desired to look at the contents of the array; i.e., the weights pertaining to each neural node which are multiplied by the input variables during the MAC operation. During inferencing, it is important that the correct weight values are read. One or more embodiments employ dynamically boosted supply 305 during MAC to ensure robustness with regard to the correct weight values; the memory 303 operates at a higher voltage compared to the bitlines during the reading. In a conventional memory, wordlines are turned on one at a time during storage. During a MAC operation, however, it is desired to turn on all the wordlines, or at least all of those wordlines having a non-zero input values (i.e., $x_j \neq 0$).

In one or more embodiments, the weights stored in the individual memory cells are binary, i.e., zero or one. However, the $x_j$ have different voltage levels (e.g., 0.4V, 0.5V, 0.6V, ...) and when the bitlines are summed according to Kirchhoff's Law, the current is collected and converted using an ADC. One aspect uses an ADC (sense amp) for each column in the memory array, or in another aspect, the current for a given column is simply collected and calibrated into different levels (directly tap the current, i.e., obtain 0.1 mA, 0.02 mA depending on how many wordlines are ON/OFF and the state of the memory). In FIG. 4, every cell 315 holds as a weight a zero or a one, but the inputs on the wordlines 313-0, ..., 313-n are adjusted. The array 303 is convertible to function as a DAC, to select a single wordline for storage (i.e. write a weight for a cell as one or zero), or to select multiple wordlines for MAC.

FIGS. 3 and 4 thus show exemplary aspects of the invention related to a reconfigurable DAC-CIM. One or more embodiments employ the peripheral logic of the memory array to implement a new technique for switching between the wordline decoder/driver to generate a MAC operation for AI. The peripheral logic includes known functionality such as pre-decoders, clock, etc.; conventional circuitry is omitted from the drawings to avoid clutter and the peripheral circuitry is shown conceptually as a block 399 in FIG. 9, discussed below. In one or more embodiments, the selection between different operations is carried out using a simple multiplexer controlled by a control signal (multiplexers 5013 and 505 are discussed below). Again, note that FIG. 4 omits, to avoid clutter, well-known functions such as those related to data, decoders, and write control; only relevant elements affecting the wordlines are depicted.

The wordline drivers 311 include, for example, n+1 such drivers numbered from 0 to n; individual drivers 311-0, 311-20, and 311-n are shown in FIG. 4 by way of example. Each wordline driver includes a digital-to-analog converter (DAC) and a multiplexer (MUX). There are n+1 wordlines numbered from 0 to n; individual wordlines 313-0, 313-20, 313-n are shown in FIG. 4 by way of example. The array 303 includes a plurality of pairs of true and complementary bit lines which intersect the word lines at a plurality of cell locations, where the individual cells 315 are located. To avoid clutter, not every cell 315 is numbered in FIG. 4. There are n+1 pairs of bitlines numbered from 0 to n. The first pair of true and complementary bitlines are labeled BLT0 and BLC0, respectively, while the last pair of true and complementary bitlines are labeled BLTn and BLCn, respectively. Individual wordlines 313-0, 313-20, 313-n are shown in FIG. 4 by way of example. The true bitlines are respectively numbered 317-0, 317-1, 317-2, 317-3, ..., 317-n−1, 317-n. The complementary bitlines are respectively numbered 319-0, 319-1, 319-2, 319-3, ..., 319-n−1, 319-n. Each pair of true and complementary bitlines forms a column; for example, BLT0 and BLC0 form column 0, BLTn and BLCn form column n, and so on.

Note the clock multiplexer select (CLK_MUX_SEL) signal line 321. Regarding the inputs 323-0, ..., 323-20, ..., 323-n, pre-decoded wordline addresses are per se known to the skilled artisan, and, given the teachings herein, the skilled artisan will be able to employ general knowledge of inputs to wordline drivers to implement one or more embodiments. The config bits for the DAC will be appreciated by the skilled artisan given the teachings herein including the discussion of subcircuit diagrams.

As indicated at 305, 325 in FIGS. 3 and 4, the voltage supply to the array of memory cells can be dynamically boosted during both the MAC and memory operations while the voltage supply to the wordlines can be dynamically boosted during memory operations. The wordline drivers 311 can switch from digital to analog mode and can also switch from voltage to current mode. Programmable clock 327 switches the wordline drivers from digital to analog mode (and back) using a multiplexer.

The pre-decoded wordline (WL) addresses and config bits are input into the units 311. The WL addresses are pre-decoded and passed through the WL drivers 311 so that in a memory/storage operation, where it is desired to store a weight, only one WL at a time is turned on, to write the weights into the array one row at a time. This can be done sequentially or randomly. In the MAC operation (during inference), the multiplexer (MUX) will switch using the config bits to turn on multiple or all of the WL (wherever there are non-zero inputs, any j where $x_j$ is non-zero; say 0 to n=255 if all have non-zero values). When it is desired to see the memory content for inference purposes, the current will flow from memory into the bitlines BL and using Kirchhoff's law, will sum up. The output is on the bitline (i.e., bitline pair BLT, BLC) and can be tapped by a sense amplifier (amp) or directly. As noted, in one or more embodiments, the weights $w^{i,j}$ stored in the cells 315 are 0 or 1. One or more embodiments employ a translation table to decode the output.

In one or more embodiments, the DAC operation employs a current unit providing a unit amount of current. By programming some digital bits, that current can be changed into a resistance using equation (1) below. In one or more embodiments, the current is programmed using 4 bits (generally, N bits), the voltage on the wordline changes, and the multiplexer, in that mode, selects the DAC output. Heretofore, memory cells have not been used as a DAC. When operating as a DAC, the input is the 4-bit code from equation (1). See discussions of FIGS. 5 and 6 below.

In one or more embodiments, a suitable controller 398 controls the various elements so that the correct signals are provided at the correct times. The controller 398 can be electrically coupled, for example, to the plurality of word line drivers and the dynamic voltage boost, and configured to cause the dynamic voltage boost to boost the cells during the multiply accumulate operation, and to cause the other operations/signals described.

It is worth noting that if desired, in one or more embodiments, data can be written into the memory array 303 in a manner that stores words in columns instead of the traditional row configuration.

Certain conventional elements are omitted from FIG. 4 to avoid clutter. For example, switch capacitors can be provided on the true and complementary bitlines for linearity. In a given column, for one switch capacitor, one plate connects to the true BL and the other to ground; for another switch capacitor, one plate connects to the complementary BL and the other to ground. The controller 398 can be implemented, for example, as a control circuit that carries out functions as defined herein; given the teachings and description of the functions herein, known control circuit technologies can be employed. For example, multicycle or pipelined, hardwired or microprogrammed, controllers can be implemented using any suitable technology family. For example, the specified functions described herein can be instantiated in logic circuitry as described below with respect to FIG. 15—a controller can be described as a finite state machine written in Verilog and implemented in hardware, for example.

Figure 5:
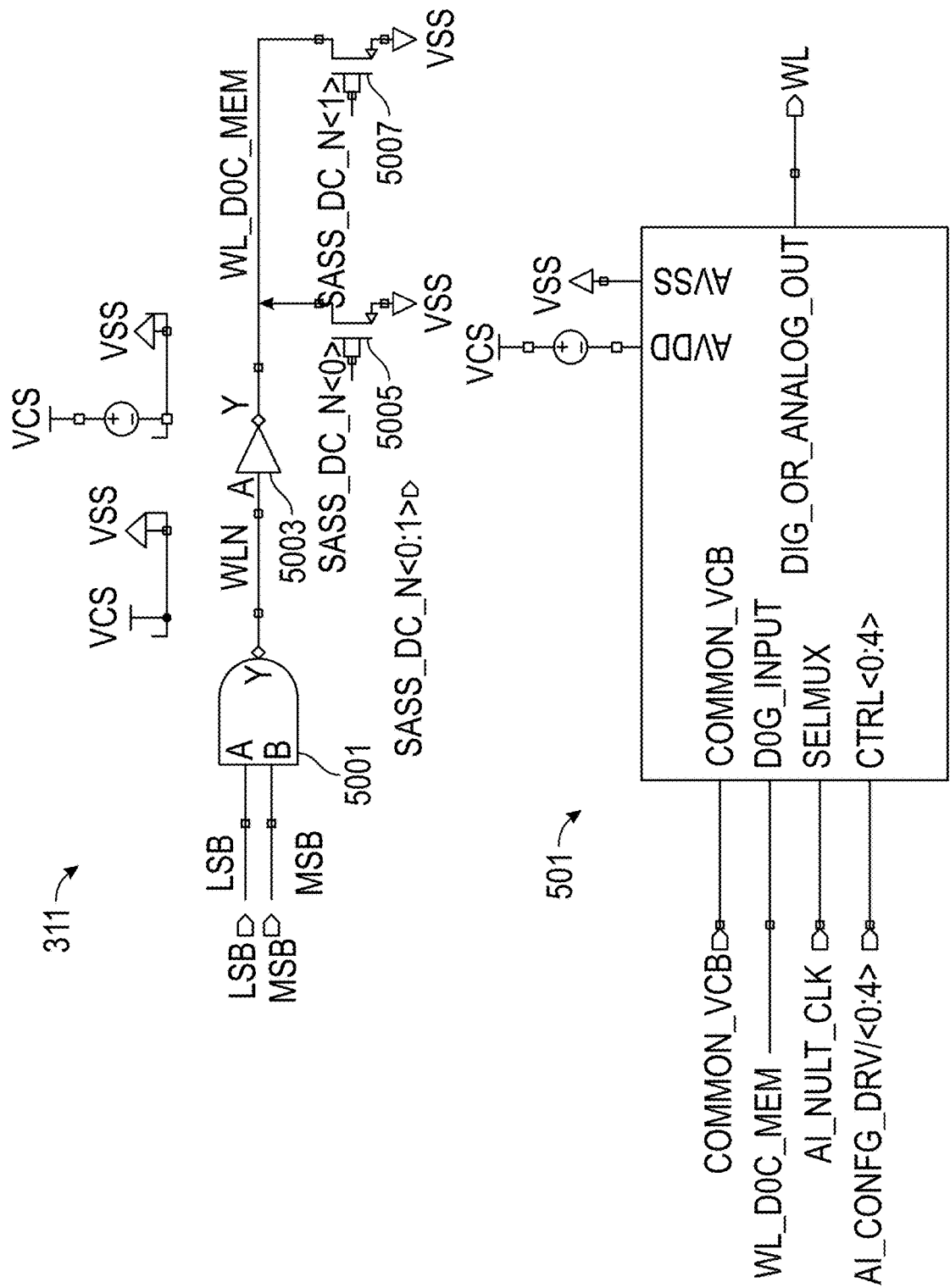
FIG. 5 shows a wordline decoder driver and digital to analog converter (DAC), according to aspects of the invention.

FIG. 5 shows an exemplary circuit diagram for a wordline decoder/driver 311 and a D/A portion 501 thereof. Note the NAND gate 5001 with least significant bit (LSB) and most significant bit (MSB) inputs and output to inverter (buffer) 5003, as well as supply voltages $V_{CS}$ and $V_{SS}$ and the PFETs 5005, 5007. FIG. 5 thus depicts a wordline driver with LSB and MSB inputs and a buffer 5003 which outputs to the word line and is fed into the MUX 501. Using the unit 501, one or more wordlines are selected.

FIG. 6 shows exemplary details including unit 501. Note the PMOS load 5009, programmable current sources 5011, and voltage multiplexer 5013.

It is worth noting that in one or more embodiments, the voltage of the bitline can represent digital information (voltages at supply rails are either 0 or VDD and the bitline voltage represents either a zero or a one) or can represent analog information (either in voltage levels or timing duration), which can be programmable with respect to a digital code, b[N−1:0] (referring to equation (1) below).

FIG. 6 provides a scheme for generating an analog voltage for the bitline and a capability to multiplex it with another voltage using a digital control. The 4-bit, binary weighted, low area current sources 5011 are programmed using digital control and summed at the output. A voltage proportional to this summed current is obtained using a PMOS pull-up load 5009, which is biased in the linear region of operation. At the output, this analog voltage (V1) is multiplexed with an input constant voltage (V2) using a multiplexer (MUX) 5013. When the DAC operation is to be enabled, the DAC current sources are selected using the N bit digital controls and the output MUX selects the DAC voltage. When a constant digital voltage needs to be used, the polarity of the digital control is reversed, and the output MUX selects the input digital voltage (V2). The equation for the analog voltage is given by (in the case where N=4):

$$V_1 = V_{DD} - I_0 * R_P [1 + b(0) + 2^1 b(1) + 2^2 b(2) + 2^3 b(3)], \quad (1)$$

where $I_0$ is the reference current to the current mirror and $R_P$ is the load resistance of the PMOS load transistor, and $V_{DD}$ is the supply voltage. Still referring to FIG. 6, note again the programmable current sources 5011. An individual current source 5015 includes two NFETS connected in a known manner. To avoid clutter, every current source 5015 is not completely illustrated. Depending on the bit associated with each of the current sources, there are two NFET transistors 5017, 5019 connected to the gate of each of the transistors in the programmable current source. One NFET 5017 passes the signal and the other NFET 5019 grounds the gate. When the bit is ON, the specific cell provides a unit amount of current. At the output, all the currents are summed up, so, depending on how many bits are ON, there are that many units of current. The current is provided to the PMOS load network 5009 causing a voltage on the intermediate node 5014 where the programmable current sources are connected to the PMOS load. That voltage on node 5014 is multiplexed in voltage MUX 5013 with the digital voltage used for the memory operation and is provided to the wordline. The transistors at location 5012 in FIG. 6 generate inversions of the incoming bits. In one or more embodiments, the individual units in 5012 are conventional CMOS inverters with control on the inputs and control bar on the outputs. Thus, in one or more embodiments, there is a switch that translates the input voltage to the gate of the transistors or else disables the transistors and connects the gate to ground. One transistor 5019 is a pulldown transistor and the other one 5017 is a pass transistor. When a given individual current source 5015 is to be turned ON, the pass transistor 5017 is closed and the pulldown transistor 5019 is turned off; when the given individual current source 5015 is to be turned OFF, the opposite happens.

In one or more embodiments, there is a current meter that is programmed with N number of bits. Depending on the combination of bits, it generates the output voltage given by equation (1). The $I_0$ is programmed using the digital bits and the voltage $V_1$ is an analog voltage which is multiplexed to the wordline. Intermediate voltage values can be generated by a codeword according to the equation. Bit width can be increased if desired. In one or more embodiments, any voltage between 0 and VDD can be generated in a step wise manner; the number of steps are determined by the number of bits used in the DAC. It will be appreciated that in one or more instances, the analog voltage on the bitline is the result of the input variable and the stored weights. In one or more embodiments, during DAC operation, the MUX controls the input variable on the pass gate/wordline. The wordline is controlled by the DAC and as a natural consequence, the bitline has the analog voltage and the DAC adds/subtracts the currents. In one or more embodiments, each wordline is 4 bits. The number of bits can be equal, for example, to the number of levels in the wordline times the number of memory elements that can be configured; say, 8 to 12 bits programmable. Again, in one or more embodiments the array 303 can function independently as a DAC separately from use with regard to a neural network.

Figure 10:
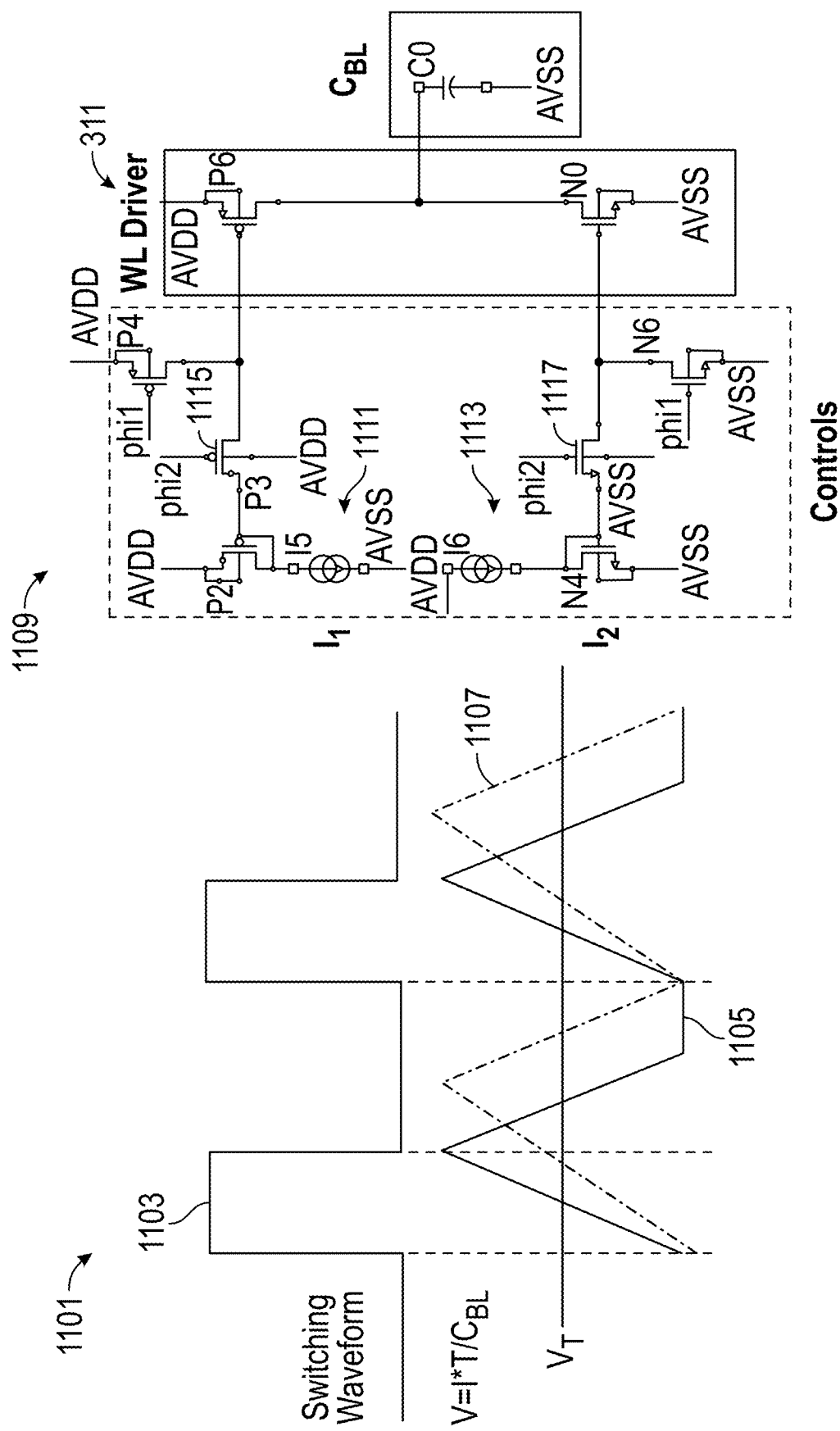
FIG. 10 shows current mode/time domain driving, according to aspects of the invention.

The analog information can also be provided in terms of pulse width, as illustrated in FIG. 10. In this case, instead of changing the analog voltage, the time duration of a pulse is changed. The currents I1 and I2 provide a triangular waveform when provided to the bitline capacitance $C_{BL}$. The tripping voltage is given by $I*T/C_{BL}$, where I represents $I_1$ and $I_2$ ($I_1=I_2$) and T represents the pulse width of the clock phase phi1. The quantities phi1 and phi2 are nonoverlapping clocks and are complementary in nature. When phi1=1, phi2=0, the capacitor starts charging, and when phi2=1, phi1=0, the capacitor starts discharging. Both the value of the current and the pulse duration provide the tripping point for the logic decision.

Figure 7:
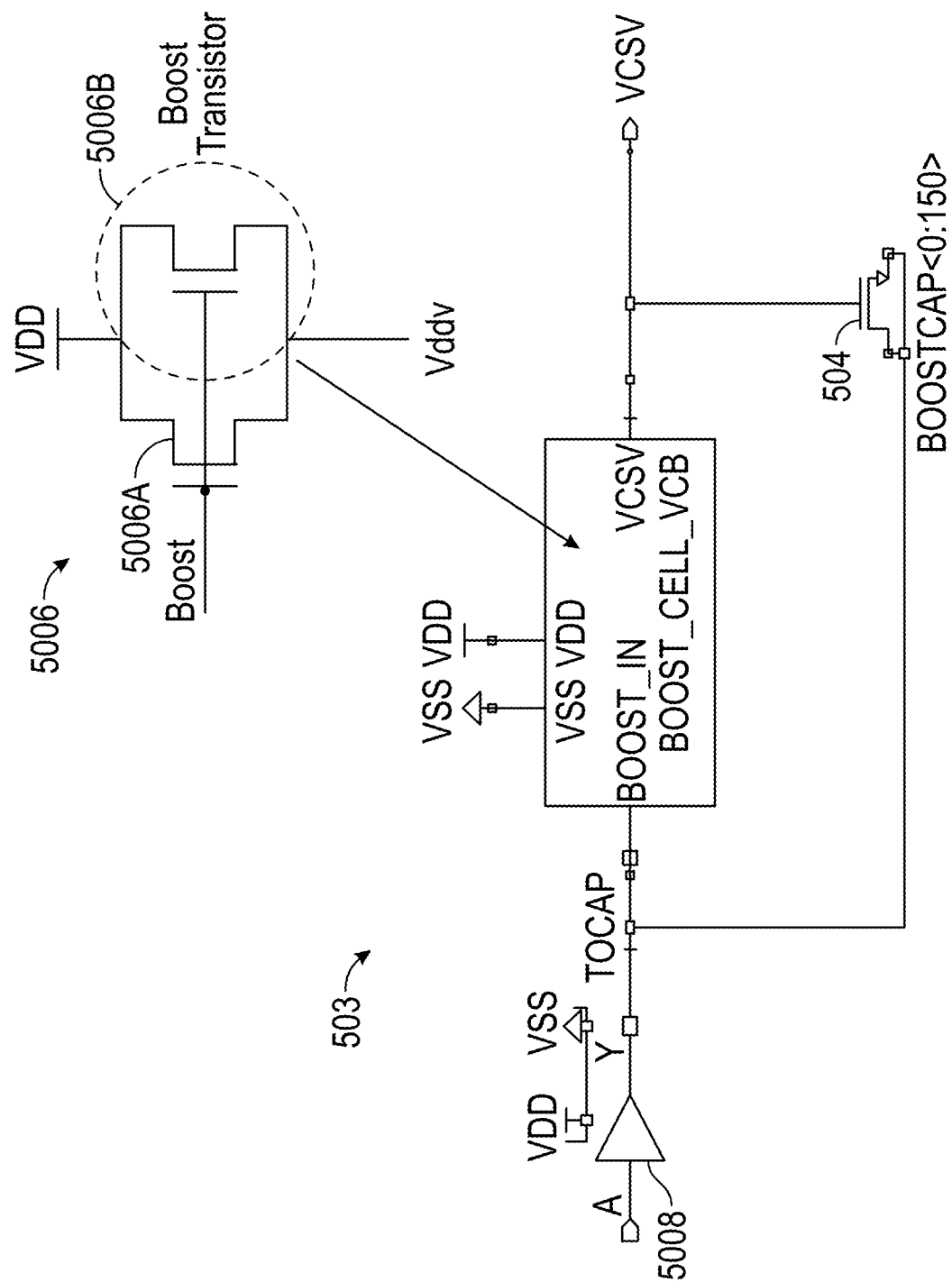
FIG. 7 shows a boosting circuit, according to aspects of the invention.

FIG. 7 shows an exemplary boosting circuit 503 for the wordline driver and memory array (to provide boost as shown at 305, 325). This circuit can be used during the MAC operation to reduce/prevent instability. For example, with usage of nanosheet device capacitance and parallel FETs shown at 5006, boosting of 0.1-0.2 V above the drain power supply rail $V_{DD}$ can be achieved for the MAC operation. This enhances robustness, from a noise perspective. Note the two transistors: PFET 5006A, and NFET 5006B, in boost cell 5006; the buffer 5008; and the capacitance at the bottom (device cap) 504 which also connects to the node Vddv. The NFET 5006B provides boost. The device cap 504 adds into the provided boost. When the signal "Boost" is LOW, Vddv=VDD because the PFET 5006A is ON and simply couples the VDD rail to the node Vddv, and the NFET 5006B is OFF. When the signal "Boost" goes HIGH, the NFET 5006B is initially sitting with its drain, gate, and source all at Vdd, so it also acts as a capacitor (since to turn an NFET ON requires $V_{GS}$>threshold voltage $V_t$). Accordingly, because the NFET 5006B is not turned ON it simply acts like a capacitor. The node Vddv is floating. When the signal "Boost" switches from LOW to HIGH, the boost transistor 5006B will boost the Vddv floating node up above VDD. Similarly, the bottom NFET 504 (also acting as a capacitor) will boost up the voltage on node Vddv. Thus, regarding the device 504, when the shorted source and drain turn ON (go from LOW to HIGH), the gate will "glitch" up to generate the boost. The boost will be ON during inference to maintain the data. Switching between boost and non-boost modes is determined by the "Boost" signal (if Boost=0, obtain Vdd; if Boost=1, obtain boosted Vddv from the switching "glitch"/dynamic pulsing of the gate). Note that the gates of transistors 5006A, 5006B are tied in the exemplary embodiment, but do not necessarily need to be tied.

The skilled artisan is familiar with the use of FETs as capacitors by adjusting the terminal voltages; the NFET does not turn ON until the gate-to-source voltage exceeds the threshold voltage and the PFET does not turn on until the gate-to-source voltage is less than the threshold voltage. When the gate, drain, and source of NFETs 5006B, 504 are at the same voltage, for example, the NFETs will not be turned ON and will function as capacitors. Optionally, where it is desired that FET devices function as capacitors, they can have a higher $V_t$ than other devices in the circuit to provide a margin so that they do not inadvertently turn ON when not desired.

Figure 8:
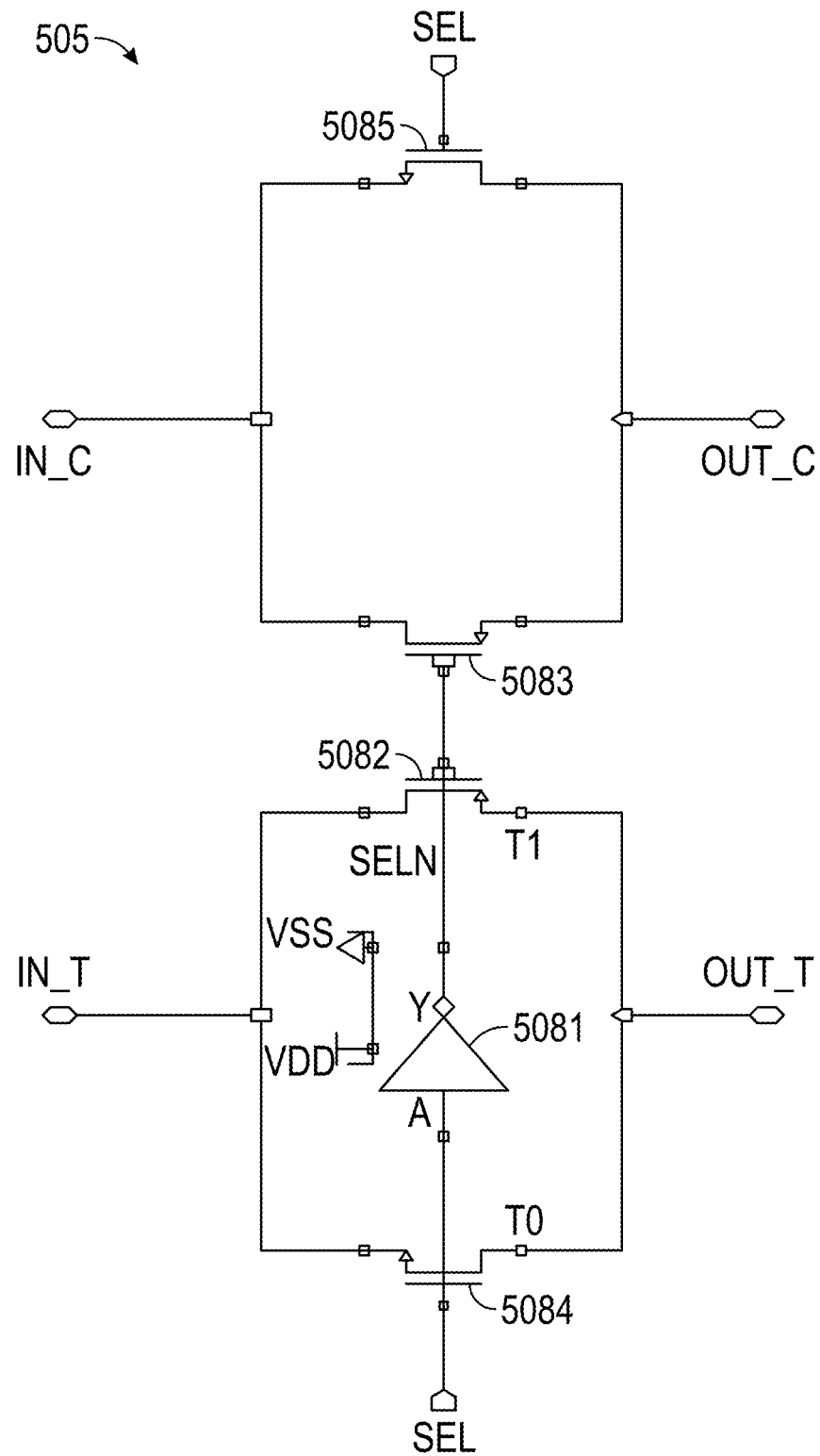
FIG. 8 shows a multiplexer used in a novel way, according to aspects of the invention.

FIG. 8 shows an example multiplexer 505 controlling the digital-to-analog switching 327 of FIG. 3, and permitting interchangeable MAC, DAC, and storage operations. Note the true input IN_T, complementary input IN_C, true output OUT_T, complementary output OUT_C, select signal SEL, inverter 5081, PFETS 5082, 5083, and NFETS 5084, 5085. Multiplexer 505 can be used to read the currents out, maintaining the value of the currents in the analog domain (when the current is summed from the bitline during the MAC operation). While multiplexers are per se known, the use here is an improvement on prior art techniques requiring sense amplifiers or complicated ADCs. At the end, the current is multiplexed from every single bitline and the current from every single bitline can be obtained separately because of the MUX—a decoder decodes the config bits and allows selection of individual columns. Then, post-processing can be carried out. FIG. 8 is thus a known circuit being used in a novel way to tap the current during the MAC operation (which also allows finding individual cell defects during the memory operation with only one wordline turned on). Note that previous techniques have considered only a single cell and single wordline whereas one or more embodiments relate to collecting the current for a plurality of wordlines, summing for an entire column and converting with a sense amplifier.

Figure 9:
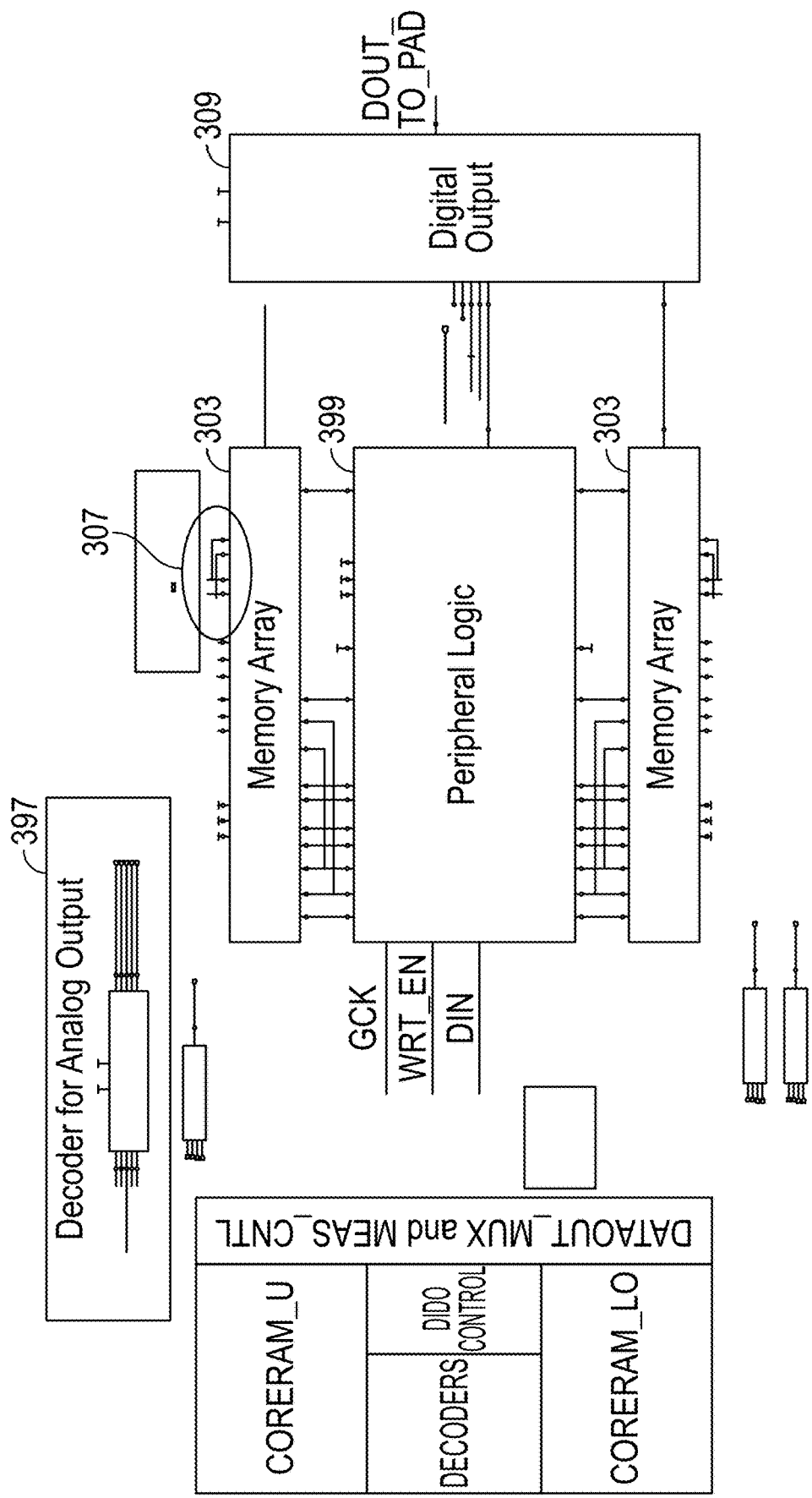
FIG. 9 is a top view of aspects of the invention.

FIG. 9 shows an exemplary top view. Note the memory arrays 303, analog output 307, digital output 309, peripheral logic 399, and decoder 397 for the analog output. The peripheral logic includes, e.g., pre-decoders, clock, etc. and as noted, conventional circuitry is omitted to avoid clutter. It will thus be appreciated that one or more embodiments include a unique circuit arrangement to produce an analog signal from digital signals to generate the xi inputs and perform the MAC operation for the stored weights. The weights can be updated though utilizing memory elements.

It will be further appreciated that one or more embodiments are configurable to carry out multiple operations. These include storage of weights using the memory array; the multiply accumulate (MAC) operation $y_i=\Sigma_j w_{i,j} x_j$ where $w_{i,j}$ are the weights and $x_j$ are the inputs (on the wordlines); and digital-to-analog conversion (DAC) in the form of the memory array.

Figure 12:
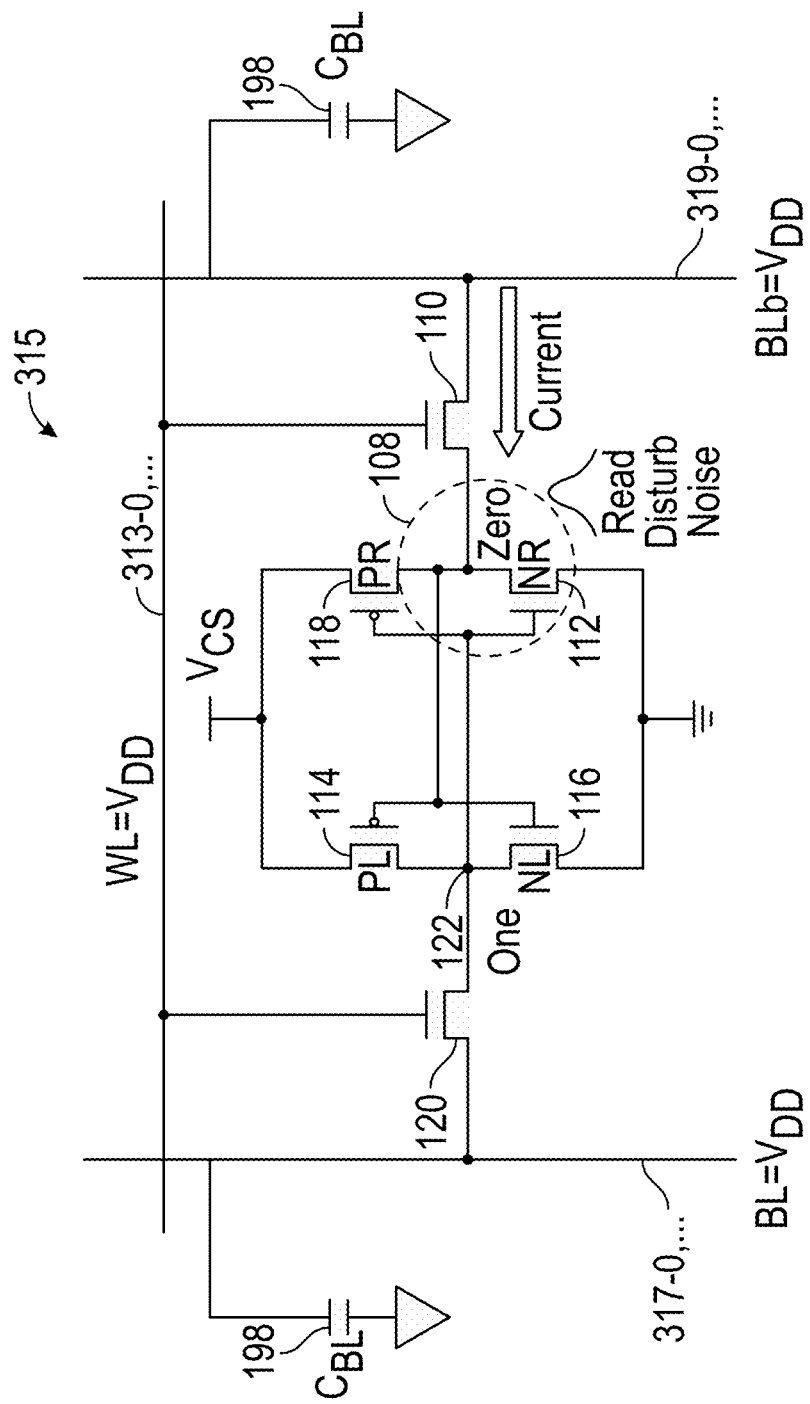
FIGS. 12 and 13 show aspects of six transistor static random access memory (SRAM) cells that can be employed in accordance with aspects of the invention.
Figure 13:
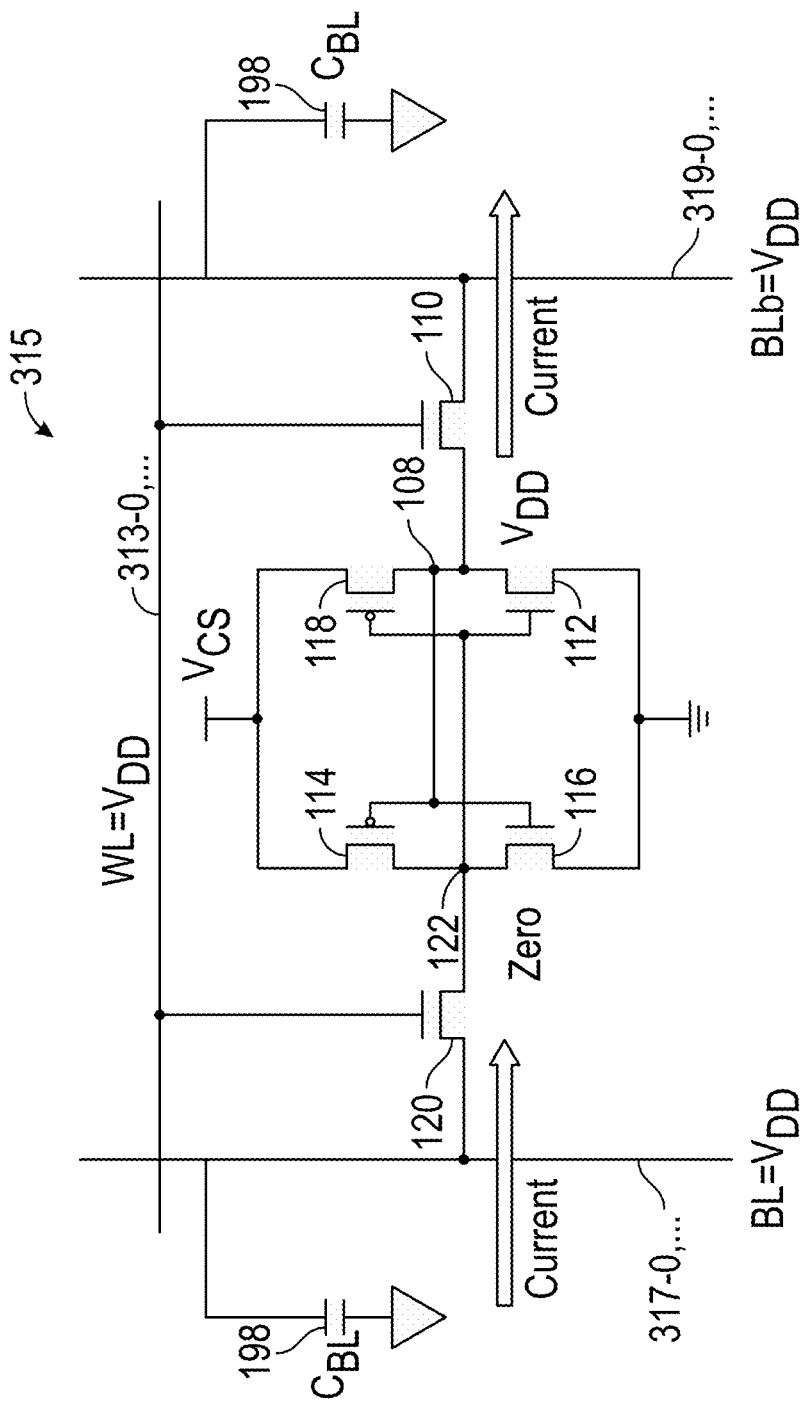

FIGS. 12 and 13 show details of an exemplary cell 315 in, respectively, READ and WRITE modes. As shown in FIG. 12, during READ mode, i.e., when the word line 313-0, . . . is asserted, both the true bitline 317-0, . . . and complementary bitline 319-0, . . . are pre-charged high via the bitline pre-charge capacitors $C_{BL}$ 198. In this condition, the voltage at the storage node 108 which has a "zero" logic value in this example goes up during the READ cycle, with the access transistor 110 forming a resistive divider with the pull-down transistor 112. This is termed "read disturb noise"; if this increased voltage is larger than the trip voltage of the inverter (PL-NL pair formed by transistors 114, 116), the stored logic values will be flipped and data will be lost. The cell 315 also includes the right-hand inverter formed by PR-NR pair 118, 112, as well as the left-hand access device 120 and storage node 122 (here storing a "one").

The read disturb noise problem can be alleviated by weakening the strength of the access transistors 110, 120. However, the access transistors cannot be made arbitrarily small, since they are used to store the correct value into the cell during the WRITE operation. During the WRITE operation, as shown in FIG. 13, the word line 313-0, . . . is asserted, with the data to be written (in this case a logical "one") and its complementary value being asserted on the true and complementary bitlines 317-0, . . . and 319-0, . . . , respectively. If the cell 315 initially contained a value of "zero" at node 120, the access device on the right side 110 needs to overpower the pull-up PMOS device 118 to write the correct value to the cell 315, and hence needs to be a strong device. Thus, there exist conflicting requirements for the strength of the access transistor 110.

Thus, with regard to the storage of weights, the weights will be written during the WRITE operation, and the pass gate 110 of the 6T SRAM cell should be strong. Thus, in one or more embodiments, by boosting the pass gate, the strength is increased and write-ability is achieved.

With regard to the MAC operation, in one or more embodiments, all the wordlines are turned ON by selecting the CLK_MUX_SEL clock 321. In this operation, all the pass gates 110, 120 are turned on. During this process, in prior art systems, the bitline cap 198 potentially overpowers weak cells and thereby corrupts the data in the cell. Erroneous data from the corrupted cell(s) can be added, resulting in poor accuracy of the MAC operation. This effect also limits the number of cells on a bitline. In one or more embodiments, by boosting the memory array voltage supply $V_{CS}$, it is guaranteed that the cells will remain stronger than the bitline supply (which is 0.1-0.15V lower than the boosted cells). In this way, accurate MAC operations can be performed in one or more embodiments.

Furthermore, during the DAC operation in prior art approaches, similar problems as for the MAC operation typically occur, resulting in poor DAC performance; one or more embodiments remedy this using the boosted, higher, supply voltage, which can advantageously be maintained with configurability for all the three operations mentioned. One or more embodiments thus provide interchangeable MAC, DAC, and storage operations through the transmission gates, as well as a current-based DAC.

Referring again to FIG. 8, in one or more embodiments, the MAC operation is tapped through the transmission gate to measure current (i.e., analog outputs). This allows detection of any defective cells for the storage elements.

Referring to FIG. 10, in one or more embodiments, the wordlines WL can be programmed via a constant pull up and pull down current. This current can, for example, be programmable by a DAC-like operation, and, as the voltage crosses $V_T$, leads to a direct bit storage. This advantageously leads to an inventive low latency operation.

In one or more embodiments, this feature is used in the MAC functionality, where the digital bits control the time duration for which the bitline turns ON. The digital control bits control the slope of the waveform applied at the wordline driver gates 311, and the driver works as a fast comparator which operates when the input waveform exceeds the threshold voltage of the driver transistors. Thus, in one or more embodiments, instead of the MAC functionality being implemented in amplitude, it is implemented as time duration. The current values can be changed, the wordline (WL) transistors will only trigger when $V>V_T$, and the 6T latch will ensure one side is at zero and the other side is at $V_{DD}$. Referring to 1101 in FIG. 10, note the switching waveform 1103 with digital bits, and the voltage plots 1105, 1107 (current I times time T divided by capacitance of bitline pre-charge capacitors $C_{BL}$). Note the conversion from a pulse width to a digital code. Heretofore, a DAC has been constructed by dropping current on a resistor, with changes in the voltage value following changes in the current value according to Ohm's law. In the example of FIG. 10, the current is programmed and dropped on capacitor $C_{BL}$; depending on the pulse width of the current 1103 a bit 0 or a bit 1 is created for a time duration. Thus, FIG. 10 shows an alternative way to construct a DAC, in the time domain. Note the threshold voltage level $V_T$.

Recall, as discussed above, in some cases, an analog voltage on the bitline depends on a digital code; there is a unit current multiplied by the code and the result is the voltage on the bitline. In an alternative approach, still referring to FIG. 10, there is an constant current and the bitline turns ON or OFF depending on when the curves 1105, 1107 are above or below Vt. The pulse width is proportional to the time duration for the ON time. Curve 1107 has more area above Vt than curve 1105 and is thus ON for a longer time. The pulse turns the PMOS and NMOS switches ON and OFF. In view 1109, note the current sources $I_1$ 1111 and $I_2$ 1113. Note also the switches 1115, 1117. The upper portion of unit 1109 including switch 1115 relates to the charging of the capacitor $C_{BL}$ (upward slope of 1105, 1107) and the lower portion of unit 1109 including switch 1117 relates to the discharging of the capacitor $C_{BL}$ (downward slope of 1105, 1107).

Figure 11:
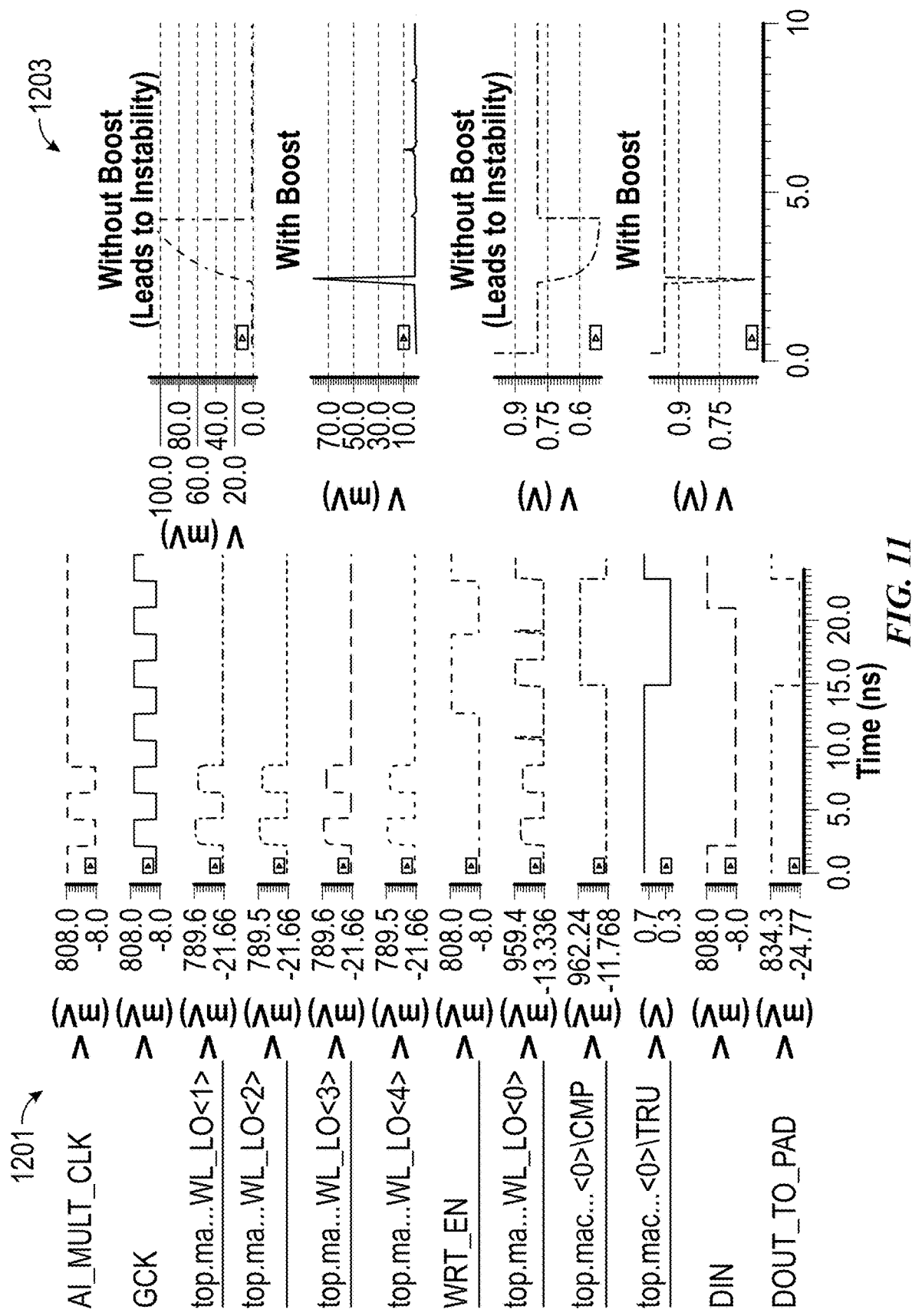
FIG. 11 shows exemplary waveforms associated with aspects of the invention.

We carried out simulations to demonstrate that aspects of the invention could be implemented, for example, using nanosheet technology. Referring to FIG. 11, view 1201 shows a number of different voltage waveforms as a function of time, while view 1203 compares several voltage waveforms with and without the voltage boosting aspect of the invention. In view 1201, the top waveform is for AI_MULT_CLK; when this signal is LOW, the system is in MAC (analog) mode, while when this signal is HIGH, the system is in digital (storage) mode. For the seventh waveform (WRT_EN), a HIGH value means WRITE while a LOW value means READ. For the first two cycles, AI_MULT_CLK goes LOW and the waveforms show generation of analog wordlines (WL_LO<0>). Digital voltages are output in the first two cycles (last waveform DOUT_TO_PAD), while in subsequent cycles, data is written into memory and read out successfully.

Regarding the signals depicted in view 1201, GCK is the global clock that generates MSB and LSB; it is an input to the peripheral logic as seen in FIG. 9. The wordline (WL) signals are also created by the clock. GCK, WRT_EN (write enable), and DIN are global signals in one or more embodiments and are all inputs to the peripheral logic in FIG. 9. In one or more embodiments, the remainder of the signals are internal signals. AI_MULT_CLK is an input to unit 501 in FIG. 5; it is buffered in one or more embodiments and goes across vertically to all the WL; when it turns ON all (or the non-zero part) of the WL turn ON. DOUT_TO_PAD is the actual data output seen at digital output 308 in FIG. 9. The signals top.mac . . . <0\CMP and top.mac . . . <0\TRU are representative of the complementary and true signals inside the 6T cells from the complementary and true bitlines at, e.g., 319-0, 317-0.

Regarding the signals top.ma . . . WL_LO<0>, top.ma . . . WL_LO<4>, the same are exemplary wordline (WL) signals; note the top/upper and bottom/lower memory arrays 303 in FIG. 9. In a non-limiting example, the top and bottom arrays 303 each have 64 WL and 80 columns, and are identical.

Regarding the waveforms seen at view 1203 in FIG. 11, the top two plots are for the side of the cell that is zero (e.g., right-hand side in FIG. 12), when the READ starts, the voltage gets increased and the zero value may become one (i.e., instability, as it is desired to hold 0). The waveform with boost according to aspects of the invention is narrower and has a lower magnitude peak, and thus advantageously reduces or eliminates the possibility of instability as compared to the prior art no boost case. The bottom two plots are for the side of the cell that is one (e.g., left-hand side in FIG. 12). The waveform with boost according to aspects of the invention is again narrower and has a lower magnitude peak, and thus advantageously reduces or eliminates the possibility of instability as compared to the prior art no boost case.

In one or more embodiments, boosting in accordance with aspects of the invention sets the voltage on the memory array higher than on the bit lines. During the prior-art MAC operation, the charge is dumped into the cells holding zero values and can "flip" the cell. This is called instability. In one or more embodiments, by boosting the voltage on the cells, the state is maintained and there is no issue of charge dumping into cell nodes 108, 122.

One or more embodiments thus provide analog-to-analog as well as digital MAC operation readouts using stored weights, as well as the capability of updating in subsequent cycles with robust functionality. In one or more embodiments, direct read-outs of MAC operations can be performed, utilizing memory and analog inputs. In one or more embodiments, the new boosting technique is used for the memory cells only during the MAC operation, advantageously preventing instability issues.

Advantageously, a lower $V_{min}$ can be achieved in one or more embodiments, through boosting techniques utilizing nanosheet technology. Furthermore in this regard, suppose the design voltage Vdd is 0.4 V and there is a boost of 0.12 V available for boosting the cells. Because of the available boost, the voltage of the periphery can be dropped to, say, Vdd=0.3 V. Lowering Vdd saves power in proportion to $Vdd^2$ and can be implemented by boosting at the critical time and place (cell) when needed to prevent errors. One or more embodiments further provide reconfigurability of the WL driver to implement a current mode MAC operation for digital bit storage.

One or more embodiments advantageously provide low latency and cost efficiency through in-memory calculations, and can be implemented, for example, using 5 nm nanosheet technology.

Thus one or more embodiments provide a system with reconfigurable current-based DAC, MAC, and storage elements with increased stability, noise margin, and functionality. One or more embodiments further provide a methodology to reconfigure the system in various modes for maximizing performance per unit consumption. In one or more embodiments, cell boosting occurs for the MAC operation, wordline and cell boosting occurs for storage, and the wordline driver circuit can be switchable from digital to analog with current based driving. Furthermore, DAC in memory can be formed through triggering the signal from an external clock.

In one or more embodiments, design a memory array (e.g., volatile memory, such as dense 6T SRAM), and design peripheral logic with wordline drivers which are switchable to operate in current or voltage mode. Provide a device-based boost circuit for both the wordline driver and the memory array. Through an external AI clock, switch between MAC and storage operations. Turn on voltage boost during the MAC operation for the cells 315 only. For the storage operation, turn on voltage boost for both the wordline 313-0, . . . , 313-20, . . . , 313-n and the cells 315 for performance. The memory can be utilized for DAC functionality.

One or more embodiments are applicable to many different applications, such as applications in AI. In one or more embodiments, reconfigurability can be achieved seamlessly. One or more embodiments are applicable to non Von-Neuman architectures, analog circuits used for the Internet of Things (IoTs), neuromorphic computing, analog deep neural networks (DNNs), and the like.

Given the discussion thus far, it will be appreciated that, in general terms, an exemplary apparatus, according to an aspect of the invention, includes a memory array 303, in turn including a plurality of word lines 313-0, . . . , 313-20, . . . , 313-n; a plurality of bit line pairs (317-0 and 319-0, 317-1 and 319-1, . . .) intersecting the plurality of word lines at a plurality of cell locations, and a plurality of memory cells 315, coupled to the plurality of word lines and the plurality of bit line pairs, and located at the plurality of cell locations. Also included are a plurality of word line drivers 311 coupled to the plurality of word lines; a dynamic voltage boost (e.g., 305) coupled to the memory array; and a controller 398 coupled to the plurality of word line drivers and the dynamic voltage boost, and configured to cause the dynamic voltage boost to boost the cells during a multiply accumulate operation. Note, unless stated to the contrary or otherwise apparent from the context, boosting refers to boosting above the power supply voltage $V_{DD}$.

In one or more embodiments, the dynamic voltage boost (e.g., 325) is also coupled to the word line drivers, and the controller is also configured to cause the dynamic voltage boost to boost the word lines and the cells during a storage operation.

In some cases, the plurality of memory cells include six transistor static random access memory cells as seen in FIGS. 12 and 13.

Referring to FIG. 7, one or more embodiments further include a voltage supply such as $V_{DD}$; the dynamic voltage boost can include at least one capacitor (e.g., 504) configured to boost the cells above the voltage supply during the multiply accumulate operation and to boost the word lines and the cells above the voltage supply during the storage operation. In some such cases, the dynamic voltage boost further includes a p-type field effect transistor 5006A having a gate coupled to the controller and configured to receive a boost enable signal from the controller, a first drain-source terminal coupled to the voltage supply, and a second drain-source terminal; and an n-type field effect transistor 5006B having a gate coupled to the gate of the p-type field effect transistor, a first drain-source terminal coupled to the voltage supply, and a second drain-source terminal coupled to the second drain-source terminal of the p-type field effect transistor to form a floating node Vddv. The at least one capacitor 504 is also coupled to the floating node; e.g., between the floating node Vddv and the gates of the other two FETs 5006A, 5006B.

In one or more embodiments, the n-type field effect transistor includes a first n-type field effect transistor 5006B, and the at least one capacitor 504 includes a second n-type field effect transistor; the two NFETS function as capacitors as described elsewhere herein.

In one or more embodiments, the plurality of memory cells 315 store neural network weights as binary values and the controller 398 is configured to cause elements $x_j$ of an input vector to be applied to the wordline drivers 311 during the multiply accumulate operation.

In one or more embodiments, the controller is configured to activate a single one of the plurality of word lines at a time during the storage operation and multiple ones of the plurality of word lines at a time during the multiply accumulate operation; the multiple ones of the plurality of word lines correspond to non-zero ones of the elements of the input vector.

In one or more embodiments, the word line drivers 311 are configured to operate in a digital mode and an analog mode.

In another aspect, an exemplary method includes providing a memory array 303 as described herein. The plurality of memory cells 315 of the array have stored therein neural network weights. During a multiply accumulate operation, elements of an input vector are applied to the wordline drivers 311, and, during the multiply accumulate operation, a dynamic voltage boost is caused to boost the plurality of memory cells.

In one or more embodiments, boosting includes boosting a floating node Vddv with at least one capacitor.

One or more embodiments further include storing the neural network weights in the plurality of memory cells during a storage operation, and causing the dynamic voltage boost to boost the word lines and the cells during the storage operation.

In one or more embodiments, the neural network weights are stored as binary values.

In one or more instances, a single one of the plurality of word lines is activated at a time during the storage operation, while multiple ones of the plurality of word lines are activated at a time during the multiply accumulate operation; the multiple ones of the plurality of word lines correspond to non-zero ones of the elements of the input vector.

As noted, one or more embodiments can also operate in a DAC mode, either stand-alone, or in conjunction with the memory and/or MAC modes. Thus, one or more embodiments include, either stand alone, or in conjunction with one or more of the other method steps, causing the memory array to enter a digital-to-analog converter (DAC) mode (e.g., provide a control signal to the plurality of word line drivers to cause the memory array to enter the DAC mode); applying a multibit digital input (i.e., while in DAC mode); and converting the multibit digital input to an analog output voltage corresponding to a supply voltage less a resistance times a unit current times an expression derived from the multibit digital input.

In one or more embodiments, the multibit digital input includes a four bit digital input including bits b(0), b(1), b(2), and b(3); the resistance is designated as $R_P$; the analog output voltage is designated as $V_1$; the supply voltage is designated as $V_{DD}$; the unit current is designated as $I_0$; and the analog output voltage is given by Equation (1). In one or more instances, the programmable current sources are engaged, and the MUX selects between DAC and MAC modes. The BLs get an analog voltage out of the DAC operation.

The alternative approach of FIG. 10 can also be employed in one or more embodiments; again, either stand alone, or in conjunction with one or more of the other method steps. Thus, one or more embodiments include causing the memory array to enter a digital-to-analog converter (DAC) mode, and operating the memory array as a time domain digital-to-analog converter (DAC) in the digital-to-analog converter (DAC) mode.

Given the teachings herein, the skilled artisan can implement the circuits herein using known integrated circuit fabrication techniques.

Figure 14:
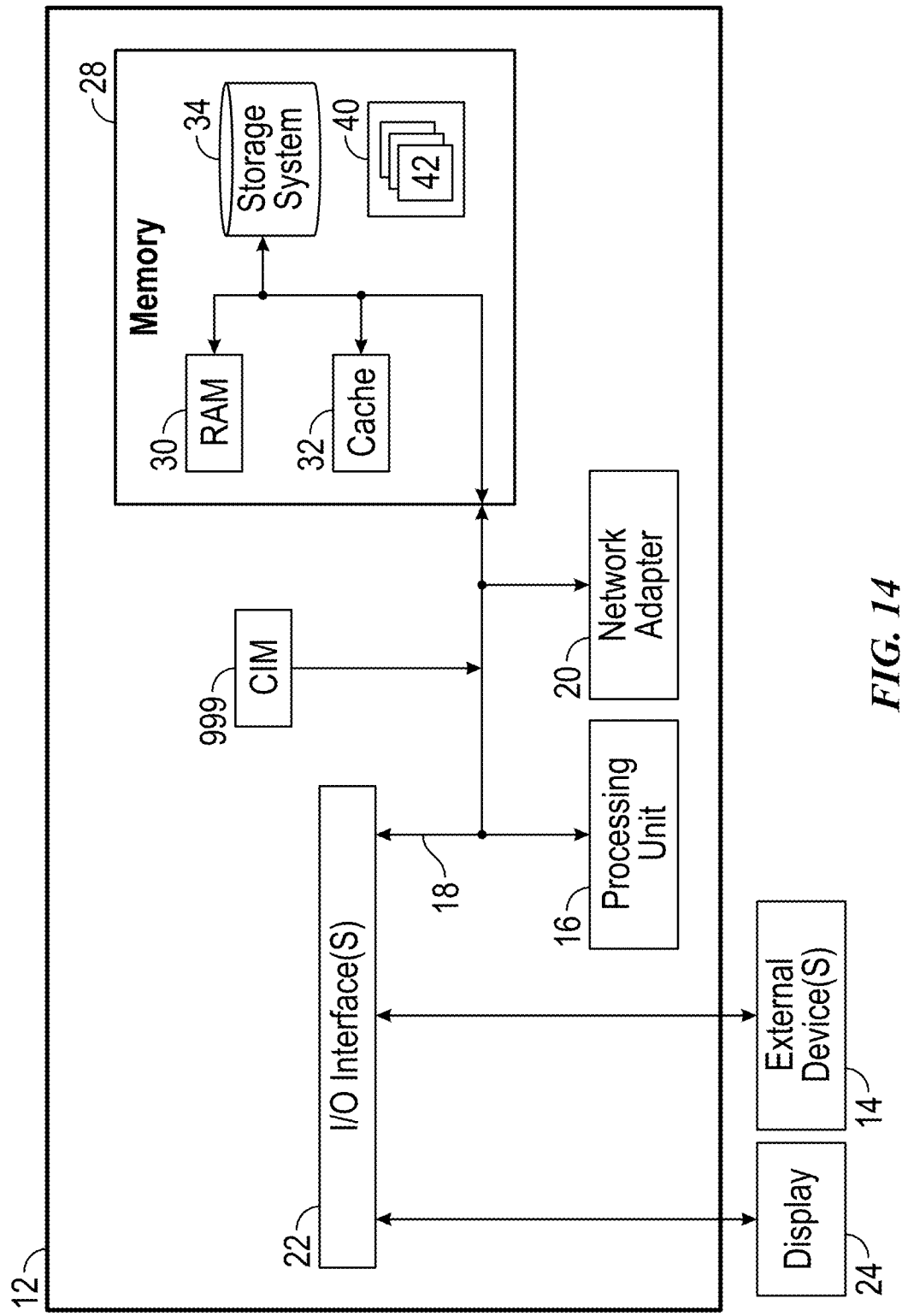
FIG. 14 depicts a computer system that uses computation-in-memory (CIM) in accordance with aspects of the invention, suitable for accelerating neural network implementation and the like (the conventional components of which are representative of a general-purpose computer that could implement a design process such as that shown in FIG. 15)

Referring to FIG. 2 view 203 and FIG. 14, some aspects of the invention can be implemented as a computation-in-memory (CIM) element 999 that uses the specialized hardware techniques to accelerate inferencing for neural networks or the like. FIG. 14 depicts a computer system 12 including such a CIM element. Computer system 12 includes, for example, one or more conventional processors or processing units 16, a system memory 28, and a bus 18 that couples various system components including system memory 28 and one or more CIM elements 999 to processor 16. The elements 999 and 16 can connect to the bus, for example, with suitable bus interface units. System 12 thus includes both a conventional Von Neumann architecture general purpose computer (elements other than 999) and a non Von Neumann CIM element 999 such as is illustrated in view 203 of FIG. 2 and implemented using techniques shown herein. The Von Neumann and non Von Neumann aspects could also be implemented separately and interface with each other instead of being included in a single system 12.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random-access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below memory 28 may include at least one program product having a set (e.g., at least one) of program modules that are configured to carry out, e.g., software-implemented portions of a neural network or digital filter.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out software-implemented functions and/or methodologies.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, and external disk drive arrays, RAID systems, tape drives, and data archival storage systems, etc.

Still with reference to FIG. 14, note processor 16, memory 28, and an input/output interface 22 to a display 24 and external device(s) 14 such as a keyboard, a pointing device, or the like. The term "processor" as used herein is intended to include any processing device, such as, for example, one that includes a CPU (central processing unit) and/or other forms of processing circuitry (e.g., 999). Further, the term "processor" may refer to more than one individual processor. The term "memory" is intended to include memory associated with a processor or CPU, such as, for example, RAM (random access memory) 30, ROM (read only memory), a fixed memory device (for example, hard drive 34), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 16, CIM 999, memory 28, and input/output interface 22 can be interconnected, for example, via bus 18 as part of a data processing unit 12. Suitable interconnections, for example via bus 18, can also be provided to a network interface 20, such as a network card, which can be provided to interface with a computer network, and to a media interface, such as a diskette or CD-ROM drive, which can be provided to interface with suitable media.

Accordingly, computer software including instructions or code for performing desired tasks, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 16 coupled directly or indirectly to memory elements 28 through a system bus 18. The memory elements can include local memory employed during actual implementation of the program code, bulk storage, and cache memories 32 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 20 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 12 as shown in FIG. 14, including conventional implementations without CIM 999) running a server program. It will be understood that such a physical server may or may not include a display and keyboard. Furthermore, FIG. 8 is also representative of a conventional general-purpose computer (e.g., without CIM 999) that could be used, for example, to implement aspects of the design process described below.

Exemplary Design Process Used in Semiconductor Design, Manufacture, and/or Test

Figure 15:
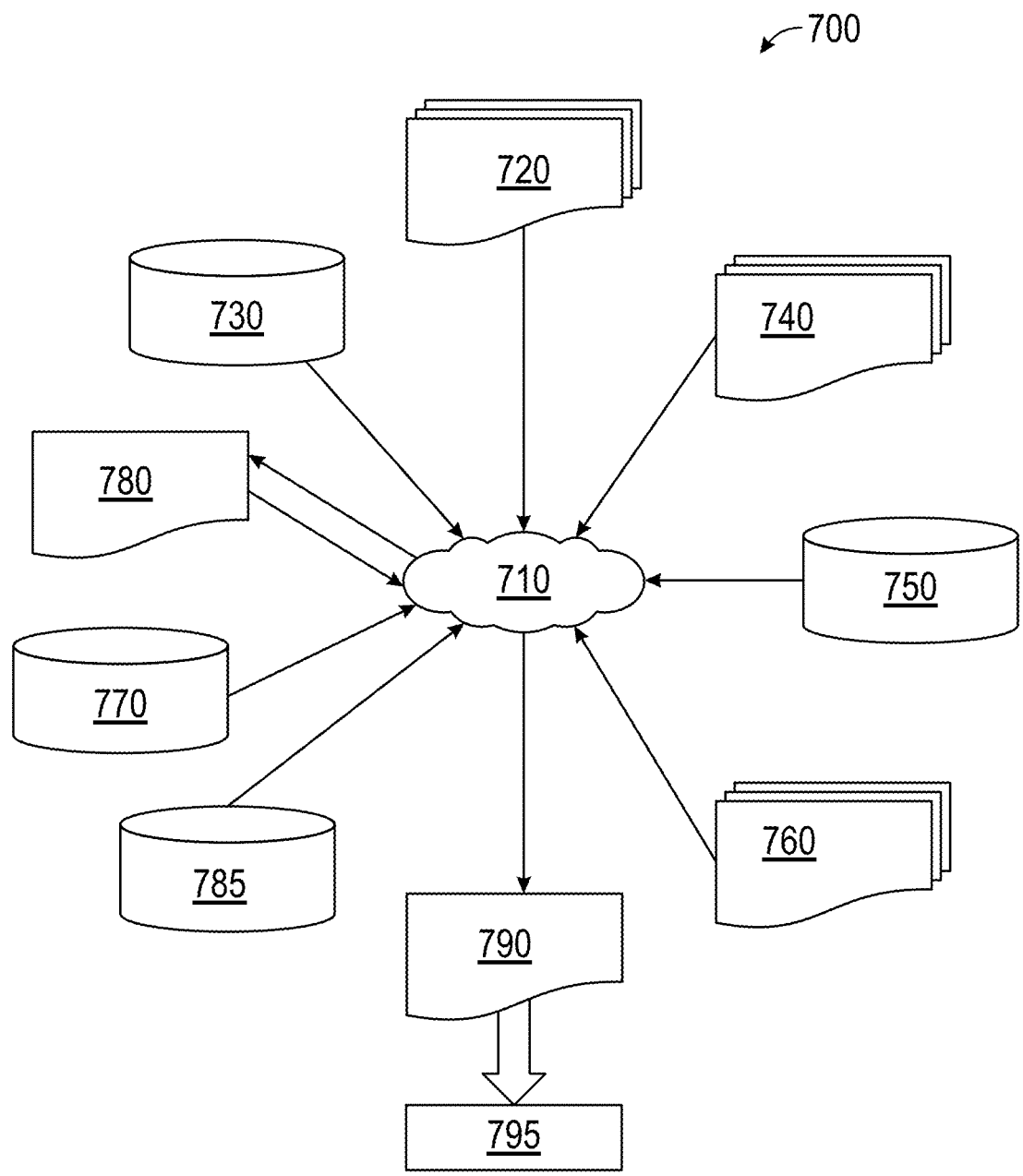
FIG. 15 is a flow diagram of a design process used in semiconductor design, manufacture, and/or test.

One or more embodiments of hardware in accordance with aspects of the invention can be implemented using techniques for semiconductor integrated circuit design simulation, test, layout, and/or manufacture. In this regard, FIG. 15 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those disclosed herein or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 15 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher-level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like as disclosed herein. In one embodiment, design structure 790 may comprise a compiled, executable HDL simulation model that functionally simulates the devices disclosed herein.

Design structure 790 may also employ a data format used for the exchange of layout data of integrated circuits and/or symbolic data format (e.g., information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein. Design structure 790 may then proceed to a stage 795 where, for example, design structure 790: proceeds to tape-out, is released to manufacturing, is released to a mask house, is sent to another design house, is sent back to the customer, etc.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
   a memory array, in turn comprising a plurality of word lines, a plurality of bit line pairs intersecting the plurality of word lines at a plurality of cell locations, and a plurality of memory cells, coupled to the plurality of word lines and the plurality of bit line pairs, and located at the plurality of cell locations;
   a plurality of word line drivers coupled to the plurality of word lines;
   a dynamic voltage boost coupled to the memory array and to the word line drivers; and
   a controller coupled to the plurality of word line drivers and the dynamic voltage boost, and configured to cause the dynamic voltage boost to boost the cells during a multiply accumulate operation and to boost the word lines and the cells during a storage operation.

2. The apparatus of claim 1, wherein the plurality of memory cells comprise six transistor static random access memory cells.

3. The apparatus of claim 1, further comprising a voltage supply, wherein the dynamic voltage boost comprises at least one capacitor configured to boost the cells above the voltage supply during the multiply accumulate operation and to boost the word lines and the cells above the voltage supply during the storage operation.

4. The apparatus of claim 3, wherein the dynamic voltage boost further comprises:
   a p-type field effect transistor having a gate coupled to the controller and configured to receive a boost enable signal from the controller, a first drain-source terminal coupled to the voltage supply, and a second drain-source terminal; and
   an n-type field effect transistor having a gate coupled to the gate of the p-type field effect transistor, a first drain-source terminal coupled to the voltage supply, and a second drain-source terminal coupled to the second drain-source terminal of the p-type field effect transistor to form a floating node;

wherein the at least one capacitor is also coupled to the floating node.

5. The apparatus of claim 4, wherein:
the n-type field effect transistor comprises a first n-type field effect transistor; and
the at least one capacitor comprises a second n-type field effect transistor.

6. The apparatus of claim 1, wherein the plurality of memory cells store neural network weights as binary values and wherein the controller is configured to cause elements of an input vector to be applied to the wordline drivers during the multiply accumulate operation.

7. The apparatus of claim 6, wherein the controller is configured to activate a single one of the plurality of word lines at a time during the storage operation and multiple ones of the plurality of word lines at a time during the multiply accumulate operation, the multiple ones of the plurality of word lines corresponding to non-zero ones of the elements of the input vector.

8. The apparatus of claim 1, wherein the word line drivers are configured to operate in a digital mode and an analog mode.

9. A method comprising:
providing a memory array, the memory array comprising a plurality of word lines, a plurality of bit line pairs intersecting the plurality of word lines at a plurality of cell locations, and a plurality of memory cells, coupled to the plurality of word lines and the plurality of bit line pairs, and located at the plurality of cell locations, the plurality of memory cells having stored therein neural network weights;
during a multiply accumulate operation, applying elements of an input vector to the wordline drivers;
during the multiply accumulate operation, causing a dynamic voltage boost to boost the plurality of memory cells;
storing the neural network weights in the plurality of memory cells during a storage operation; and
causing the dynamic voltage boost to boost the word lines and the cells during the storage operation.

10. The method of claim 9, wherein storing the neural network weights comprises storing the neural network weights as binary values.

11. The method of claim 9, further comprising:
activating a single one of the plurality of word lines at a time during the storage operation; and
activating multiple ones of the plurality of word lines at a time during the multiply accumulate operation, the multiple ones of the plurality of word lines corresponding to non-zero ones of the elements of the input vector.

12. The method of claim 9, further comprising:
causing the memory array to enter a digital-to-analog converter (DAC) mode;
applying a multibit digital input; and
converting the multibit digital input to an analog output voltage corresponding to a supply voltage less a resistance times a unit current times an expression derived from the multibit digital input.

13. The method of claim 12, wherein:
the multibit digital input comprises a four bit digital input comprising bits $b(0)$, $b(1)$, $b(2)$, and $b(3)$;
the resistance is designated as $R_P$;
the analog output voltage is designated as $V_1$;
the supply voltage is designated as $V_{DD}$;
the unit current is designated as $I_0$; and
the analog output voltage is given by:
$$V_1 = V_{DD} - I_0 * R_P [1 + b(0) + 2^1 b(1) + 2^2 b(2) + 2^3 b(3)].$$

14. The method of claim 9, further comprising:
causing the memory array to enter a digital-to-analog converter (DAC) mode; and
operating the memory array as a time domain digital-to-analog converter (DAC) in the digital-to-analog converter (DAC) mode.

15. The method of claim 9, wherein, in the providing step, the plurality of memory cells comprise six transistor static random access memory cells.

16. The method of claim 9, wherein causing the dynamic voltage boost to boost the plurality of memory cells comprises boosting a floating node with at least one capacitor.

* * * * *